United States Patent
Cho et al.

(10) Patent No.: US 11,244,628 B2
(45) Date of Patent: Feb. 8, 2022

(54) DISPLAY DEVICE

(71) Applicant: Samsung Display Co., LTD., Yongin-si (KR)

(72) Inventors: Seung Hwan Cho, Yongin-si (KR); Ki Nyeng Kang, Sejong-si (KR); Sang Hoon Lee, Hwaseong-si (KR); Sun Ho Kim, Seongnam-si (KR); Tae Woo Kim, Seoul (KR); Tae Hoon Yang, Yongin-si (KR); Jong Hyun Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/832,668

(22) Filed: Mar. 27, 2020

(65) Prior Publication Data
US 2020/0380918 A1 Dec. 3, 2020

(30) Foreign Application Priority Data

May 27, 2019 (KR) .......................... 10-2019-0061685

(51) Int. Cl.
*G09G 3/3266* (2016.01)
*G09G 3/3258* (2016.01)

(52) U.S. Cl.
CPC ......... *G09G 3/3266* (2013.01); *G09G 3/3258* (2013.01); *G09G 2380/02* (2013.01)

(58) Field of Classification Search
CPC .............. G09G 3/3266; G09G 3/3258; G09G 2380/02; H01L 27/3276
See application file for complete search history.

(56) References Cited

U.S. PATENT DOCUMENTS

| | | | |
|---|---|---|---|
| 2010/0276189 A1* | 11/2010 | Song | H01L 23/49838 174/260 |
| 2016/0204177 A1* | 7/2016 | Kim | H01L 27/1222 257/40 |
| 2016/0210896 A1* | 7/2016 | Gil | H01L 51/00 |
| 2016/0284267 A1* | 9/2016 | Gil | H01L 27/124 |
| 2017/0053975 A1* | 2/2017 | Cho | H01L 27/1255 |

(Continued)

FOREIGN PATENT DOCUMENTS

CN 108873510 11/2018
EP 3 273 436 1/2018

(Continued)

OTHER PUBLICATIONS

Extended European Search Report corresponding to European Application No. 20172830.0 dated Oct. 9, 2020.

*Primary Examiner* — Amy Onyekaba
(74) *Attorney, Agent, or Firm* — Kile Park Reed & Houtteman PLLC

(57) ABSTRACT

A display device including a substrate including a display area and a non-display area, a plurality of signal lines disposed in the display area and extending along a first direction and from the non-display area to the display area, a connection line extending from the non-display area and electrically connected to a respective signal line of the plurality of signal lines in the non-display area, and an initialization voltage line extending in a second direction intersecting the first direction, wherein the connection line overlaps the initialization voltage line in a thickness direction of the display device.

20 Claims, 29 Drawing Sheets

(56) References Cited

U.S. PATENT DOCUMENTS

| | | | | |
|---|---|---|---|---|
| 2017/0077207 A1* | 3/2017 | Kim | ............... | H01L 27/3265 |
| 2017/0345883 A1* | 11/2017 | Song | ............... | G09G 3/3233 |
| 2018/0006105 A1* | 1/2018 | Kim | ............... | H01L 27/3262 |
| 2018/0074361 A1* | 3/2018 | Chung | ............... | H05K 5/02 |
| 2018/0076273 A1* | 3/2018 | Kim | ............... | H01L 27/3246 |
| 2018/0102400 A1* | 4/2018 | Choi | ............... | H01L 27/3276 |
| 2018/0158895 A1* | 6/2018 | Lee | ............... | H01L 27/3258 |
| 2018/0226459 A1* | 8/2018 | Bae | ............... | H01L 27/124 |
| 2018/0249046 A1* | 8/2018 | Son | ............... | H01L 27/124 |
| 2018/0331124 A1* | 11/2018 | Cho | ............... | H01L 27/1218 |
| 2018/0331171 A1* | 11/2018 | Kim | ............... | H01L 27/3223 |
| 2019/0088209 A1* | 3/2019 | Kang | ............... | G09G 3/3266 |
| 2019/0088731 A1* | 3/2019 | Lee | ............... | H01L 27/124 |
| 2019/0109184 A1* | 4/2019 | Li | ............... | G09G 3/3688 |
| 2020/0027901 A1 | 1/2020 | Cho et al. | | |
| 2020/0402466 A1* | 12/2020 | Park | ............... | G09G 3/3266 |

FOREIGN PATENT DOCUMENTS

| | | |
|---|---|---|
| EP | 3 401 896 | 11/2018 |
| KR | 10-2018-0125061 | 11/2018 |

\* cited by examiner

DT: DT_ACT, DT_G, DT_S, DT_D
ST1: ACT1, G1, S1, D1
ST2: ACT2, G2, S2, D2
ST3: ACT3, G3, S3, D3
ST4: ACT4, G4, S4, D4
ST5: ACT5, G5, S5, D5
ST6: ACT6, G6, S6, D6
C: CE1, CE2

DT: DT_ACT, DT_G, DT_S, DT_D
ST1: ACT1, G1, S1, D1
ST2: ACT2, G2, S2, D2
ST3: ACT3, G3, S3, D3
ST4: ACT4, G4, S4, D4
ST5: ACT5, G5, S5, D5
ST6: ACT6, G6, S6, D6
C: CE1, CE2

DT: DT_ACT, DT_G, DT_S, DT_D
ST1: ACT1, G1, S1, D1
ST2: ACT2, G2, S2, D2
ST3: ACT3, G3, S3, D3
ST4: ACT4, G4, S4, D4
ST5: ACT5, G5, S5, D5
ST6: ACT6, G6, S6, D6
C: CE1, CE2

DISPLAY DEVICE

CROSS-REFERENCE TO RELATED APPLICATION

This application claims priority from Korean Patent Application No. 10-2019-0061685 under 35 U.S.C. § 119, filed on May 27, 2019 in the Korean Intellectual Property Office, the entire contents of which are herein incorporated by reference.

BACKGROUND

1. Technical Field

The present disclosure relates to a display device, and more specifically, to a configuration therefor optimizing a size of an overall display area as well as the quality of the display of an image to be displayed in the display area.

2. Description of the Related Art

The importance of display devices has steadily increased with the development of multimedia technology. Accordingly, various types of display devices such as a liquid crystal display (LCD) device, an organic light emitting diode (OLED) display device and the like have been used. Among them, the OLED display device is a display device having an excellent viewing angle due to its self-light-emitting element. As a result, the OLED display device has grown in popularity for use in a multiplicity of applications.

The OLED display device includes a pixel circuit and a driver for driving the pixel circuit. The driver may include a scan driver for providing a scan signal to the pixel circuit, and a data driver for providing a data signal to the pixel circuit. The driving circuit of the scan driver and the data driver may be disposed in a non-display area adjacent to a display area, wherein the non-display area may be a type of dead space in terms of functionality of the display device. Thus, it would be desirable to limit a size of the non-display area, wherein a result of doing so may be an increase in the size of the display area of the display device.

SUMMARY

The disclosure provides a display device capable of minimizing a non-display area of the display device and preventing deterioration of a display quality of an image to be displayed.

However, aspects of the disclosure are not restricted to those set forth herein. The above and other aspects of the disclosure will become more apparent to one of ordinary skill in the art to which the disclosure pertains by referencing the detailed description of the disclosure given below.

According to an aspect of the disclosure, there is provided a display device including a substrate including a display area and a non-display area, a plurality of signal lines disposed in the display area and extending along a first direction and from the non-display area on the substrate to the display area, a connection line extending from the non-display area and electrically connected to a respective signal line of the plurality of signal lines in the non-display area, and an initialization voltage line extending in a second direction intersecting the first direction, wherein the connection line overlaps the initialization voltage line in a thickness direction of the display device.

The display device may further include a second conductive layer which may include the initialization voltage line, a third conductive layer disposed on the second conductive layer, and which may include respective signal line of the plurality of signal lines, and a fourth conductive layer disposed on the third conductive layer, and which includes the connection line.

The display device may further include a first source voltage line disposed between the initialization voltage line and the connection line, and wherein the first source voltage line may overlap the connection line in the thickness direction of the display device.

The display device may further include a scan line disposed between the substrate and the initialization voltage line, and wherein the first source voltage line may overlap the scan line in the thickness direction of the display device.

The display device may further include a first conductive layer disposed between the substrate and the second conductive layer, and which may include the scan line, and wherein the third conductive layer may include the first source voltage line.

The connection line may include a horizontal portion extending in the second direction, and the initialization voltage line may be disposed between the horizontal portion and the scan line in plan view.

The horizontal portion may overlap the first source voltage line in the thickness direction of the display device.

The display device may further include an anode electrode disposed between the connection line and another connection line respectively connected to another respective signal line of the plurality of signal lines, wherein the horizontal portion may be offset from the anode electrode in the thickness direction of the display device.

The initialization voltage line may overlap the scan line in the thickness direction of the display device.

The display device may further include a coupling blocking layer disposed between the initialization voltage line and the connection line, wherein the coupling blocking layer overlaps the connection line in the thickness direction of the display device.

The display device may further include a first source voltage line disposed between the initialization voltage line and the connection line, wherein the coupling blocking layer may be electrically connected to the first source voltage line.

According to an aspect of the disclosure, there is provided a display device comprising a substrate including a display area and a non-display area, an initialization voltage line disposed on the substrate, a plurality of signal lines disposed over the display area and the non-display area and extending in a first direction, a plurality of connection lines disposed in the display area and connected to the signal lines, respectively, and an anode electrode disposed between a first connection line and a second connection line of the plurality of connection lines, wherein each connection line includes a horizontal portion extending in a second direction intersecting the first direction, and the horizontal portion overlaps the initialization voltage line in a thickness direction of the display device, and may be offset from the anode electrode.

In an embodiment, the horizontal portion may include a first horizontal portion disposed adjacent to one side of the anode electrode and a second horizontal portion disposed adjacent to another side of the anode electrode in plan view, and the second horizontal portion may include a bent portion which may be bent to correspond to an edge of the anode electrode.

The first horizontal portion may include a first branch pattern protruding from one side of the first horizontal portion in the first direction intersecting the second direction and a second branch pattern protruding from another side of the first horizontal portion in a direction opposite to the first direction, and the second horizontal portion includes a third branch pattern protruding from one side of the second horizontal portion in the first direction and a fourth branch pattern protruding from another side of the second horizontal portion in the direction opposite to the first direction.

The second branch pattern and the third branch pattern may be disposed adjacent to and spaced from each other to define a gap therebetween, and the gap may overlap the anode electrode.

The anode electrode may be disposed between the second branch pattern and the third branch pattern, and may be offset from the second branch pattern and the third branch pattern.

The display device may further include a second conductive layer which may include the initialization voltage line, a third conductive layer disposed on the second conductive layer, and which may include the plurality of signal lines, and a fourth conductive layer disposed on the third conductive layer, and which may include the connection line.

The display device may further include a scan line disposed between the substrate and the initialization voltage line, and wherein the scan line may be offset from the horizontal portion in the thickness direction of the display device.

The display device may further include a first source voltage line disposed between the initialization voltage line and the connection line, and wherein the first source voltage line may overlap the connection line in the thickness direction of the display device.

The display device may further include a first conductive layer disposed between the substrate and the second conductive layer, and which may include the scan line, and wherein the third conductive layer may include the first source voltage line.

According to an embodiment of the disclosure, a display device may include connection lines for transmitting data signals to signal lines disposed in a display area. Thus, it may be possible to reduce a dead space of the display device.

Also, it may be possible to prevent parasitic capacitance from being formed between the scan line and the connection line, thereby minimizing a coupling phenomenon between the two lines. Accordingly, it may be possible to minimize or prevent non-uniformity in luminance among pixels due to distortion of the data signal, thereby improving the display quality of an image to be displayed.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
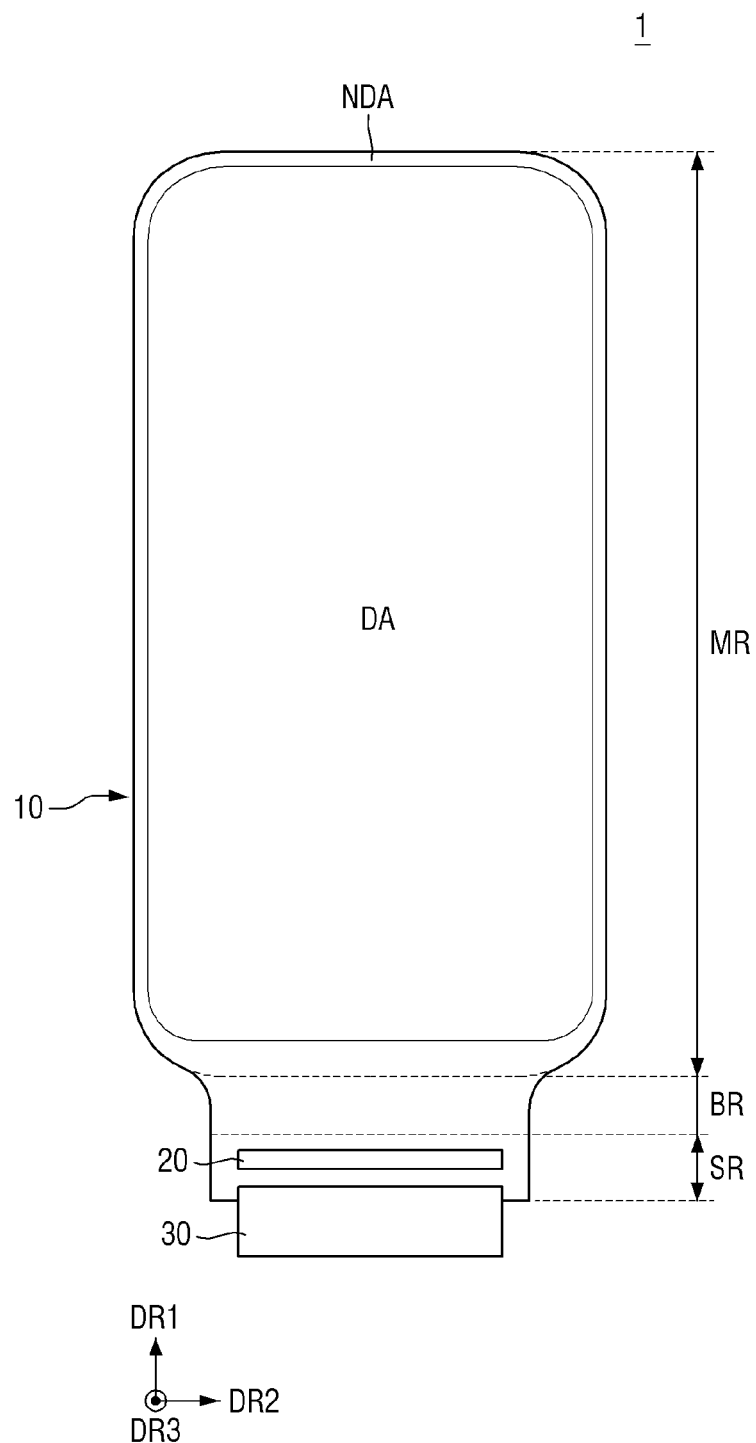
FIG. 1 shows a plan view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein.

Although the disclosure may be modified in various manners and have additional embodiments, embodiments are illustrated in the accompanying drawings and will be mainly described in the specification. However, the scope of the disclosure is not limited to the embodiments in the accompanying drawings and the specification and should be construed as including all the changes, equivalents and substitutions included in the spirit and scope of the disclosure.

The drawings and description are to be regarded as only illustrative in nature, and thus are not limiting of embodiments described and claimed herein. Some of the parts which are not associated with the description may not be provided in order to describe embodiments of the disclosure and like reference numerals refer to like elements throughout the specification.

In the drawings, a size and thickness of each element are arbitrarily represented for better understanding and ease of description, however the disclosure is not limited thereto. In the drawings, the thickness of layers, panels, regions, and other elements may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a cross-sectional view" means when a cross-section taken by vertically cutting an object portion is viewed from the side. Additionally, the terms "overlap" or "overlapped" mean that a first object may be above or below or to a side of a second object, and vice versa. The terms "face" and "facing" mean that a first object may directly or indirectly oppose a second object. In a case in which a third object intervenes between the first and second object, the first and second objects may be understood as being indirectly opposed to one another, although still facing each other. When a layer, region, substrate, or area, is referred to as being "on" another layer, region, substrate, or area, it may be directly on the other region, substrate, or area, or intervening regions, substrates, or areas, may be present therebetween. Conversely, when a layer, region, substrate, or area, is referred to as being "directly on" another layer, region, substrate, or area, intervening layers, regions, substrates, or areas, may be absent therebetween. Further when a layer, region, substrate, or area, is referred to as being "below" another layer, region, substrate, or area, it may be directly below the other layer, region, substrate, or area, or intervening layers, regions, substrates, or areas, may be present therebetween. Conversely, when a layer, region, substrate, or area, is referred to as being "directly below" another layer, region, substrate, or area, intervening layers, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments will be described with reference to the accompanying drawings. In the following description, an organic light emitting display device may be used as an example of a display device.

Figure 2:
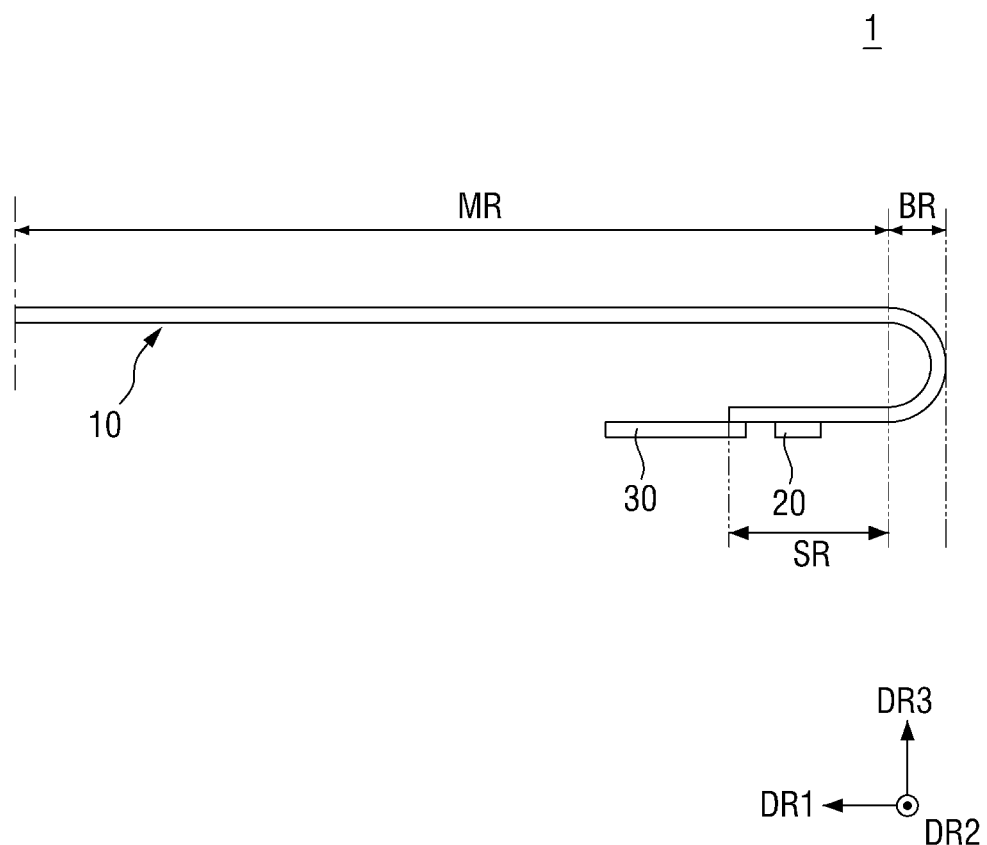
FIG. 2 shows a schematic cross-sectional view of a display device according to an embodiment.

FIG. 1 shows a plan view of a display device according to an embodiment. FIG. 2 shows a schematic cross-sectional view of a display device according to an embodiment.

Referring to FIGS. 1 and 2, a display device 1 may be a device for displaying a moving image or a still image. The display device 1 may be used as a display screen of various products such as televisions, laptop computers, monitors, billboards and the Internet of Things as well as portable electronic devices such as mobile phones, smart phones, tablet personal computers (tablet PCs), smart watches, watch phones, mobile communication terminals, electronic notebooks, electronic books, portable multimedia players (PMPs), navigation systems and ultra mobile PCs (UMPCs).

The display device 1 may include a display panel 10. The display panel 10 may be a flexible substrate including a flexible polymer material such as polyimide or the like. Accordingly, the display panel 10 may be bent, folded or rolled.

The display panel 10 may include a main region MR and a bending region BR connected to one side of the main region MR. The display panel 10 may further include a sub-region SR which may be connected to the bending region BR and overlaps the main region MR in a thickness direction of the display device 1. Herein, the thickness direction may be understood to correspond to a direction DR3 (discussed below) that is a direction extending through the main region MR. In other words, the thickness direction may be a direction along a schematic cross-sectional view and passing through each of the elements depicted in the schematic cross-sectional view.

The display panel 10 may include a display area DA for displaying a screen, and a non-display area NDA excluding the display area DA. The display area DA may include pixels. Each pixel may include a light emitting layer and a circuit layer for controlling the amount of light emitted from the light emitting layer. The circuit layer may include a display wiring, a display electrode and at least one transistor. The light emitting layer may include an organic light emitting material. The light emitting layer may be encapsulated by an encapsulation layer. A detailed configuration of the pixel will be described later. The display area DA may have a rectangular shape or a rectangular shape with rounded corners. However, the disclosure may not be limited thereto, and the display area DA may have various shapes such as a square, other polygons, a circle, an ellipse or the like.

The display area DA may be disposed in the main region MR. A peripheral edge portion of the display area DA in the main region MR, the bending region BR and the sub-region SR may be the non-display area NDA. However, the disclosure may not be limited thereto, and the bending region BR and the sub-region SR may also include the display area DA.

The main region MR may have a shape similar to an outer shape of the display device 1 in plan view. The main region MR may be a flat region located on one surface. However, the disclosure may not be limited thereto, and at least one edge of the remaining edges except an edge (side) of the main region MR connected to the bending region BR may be bent in a curved shape or bent in a vertical direction.

In a case that at least one of the edges other than the edge of the main region MR connected to the bending region BR is curved or bent, the display area DA may also be disposed on the corresponding edge. However, the disclosure may not be limited thereto, and, as an example, the non-display area NDA that does not display a screen may be disposed on the curved or bent edge. As another example, both the display area DA and the non-display area NDA may be disposed thereon.

The non-display area NDA may be located around the display area DA in the main region MR. The non-display area NDA of the main region MR may be placed in an area from the outer boundary of the display area DA to the edge of the display panel 10. Signal lines DL, connection lines DM and/or driving circuits may be disposed in the non-display area NDA of the main region MR to apply a signal to the display area DA. Further, the outermost black matrix may be disposed in the non-display area NDA of the main region MR.

The bending region BR may be connected to the main region MR. For example, the bending region BR may be connected through one short side of the main region MR. The width of the bending region BR in a second direction DR2 may be smaller than the width of the main region MR in the second direction DR2. A connection portion between the main region MR and the bending region BR may have an L-shaped cut portion.

In the bending region BR, the display panel 10 may be bent with a curvature in a direction opposite to a third direction DR3, i.e., a direction opposite to and passing through a display surface. The bending region BR may have a constant radius of curvature. However, the disclosure may not be limited thereto, and the bending region BR may have a different radius of curvature for each section. The surface of the display panel 10 may be reversed as the display panel 10 is bent in the bending region BR. In other words, one surface of the display panel 10 facing upward may be changed to face outward through the bending region BR and then to face downward.

The sub-region SR may extend from the bending region BR. The sub-region SR may extend in a direction parallel to the main region MR from a point where bending is completed. The sub-region SR may overlap the main region MR in the third direction DR3, i.e., in the thickness direction, of the display panel 10. The sub-region SR may overlap the non-display area NDA of the edge of the main region MR and further overlap the display area DA of the main region MR.

The width of the sub-region SR in the second direction DR2 may be equal to the width of the bending region BR in the second direction DR2.

A driving chip 20 may be disposed on the sub-region SR of the display panel 10. The driving chip 20 may include an integrated circuit for driving the display panel 10. In an embodiment, the integrated circuit may be a data driving integrated circuit that generates and provides a data signal. The driving chip 20 may be mounted on the display panel 10 in the sub-region SR. The driving chip 20, which may be mounted on one surface of the display panel 10 which may be the same surface as the display surface, may be mounted on the surface of the display panel 10 facing in the direction opposite to the third direction DR3 as the bending region BR is bent and reversed as described above such that the upper surface of the driving chip 20 faces in the direction opposite to the third direction DR3.

The driving chip 20 may be attached onto the display panel 10 through an anisotropic conductive film or through ultrasonic bonding. The width of the driving chip 20 in the second direction DR2 may be smaller than the width of the display panel 10 in the second direction DR2. The driving chip 20 may be disposed in a central portion of the sub-region SR in the second direction DR2. The left edge and the right edge of the driving chip 20 may be separated from the left edge and the right edge of the sub-region SR, respectively.

A display driving substrate 30 may be connected to an end portion of the sub-region SR of the display panel 10. A pad portion may be provided at the end portion of the sub-region SR, and the display driving substrate 30 may be connected to the pad portion. The display driving substrate 30 may be a flexible printed circuit board or film.

Signal lines DL and connection lines DM may be arranged in the sub-region SR, the bending region BR and the main region MR. The signal lines DL and the connection lines DM may extend from the sub-region SR to the main region MR via the bending region BR. For example, the signal lines DL and the connection lines DM may extend from the non-display area NDA and be disposed in the display area DA.

Hereinafter, the signal lines and the connection lines will be described in detail.

Figure 3:
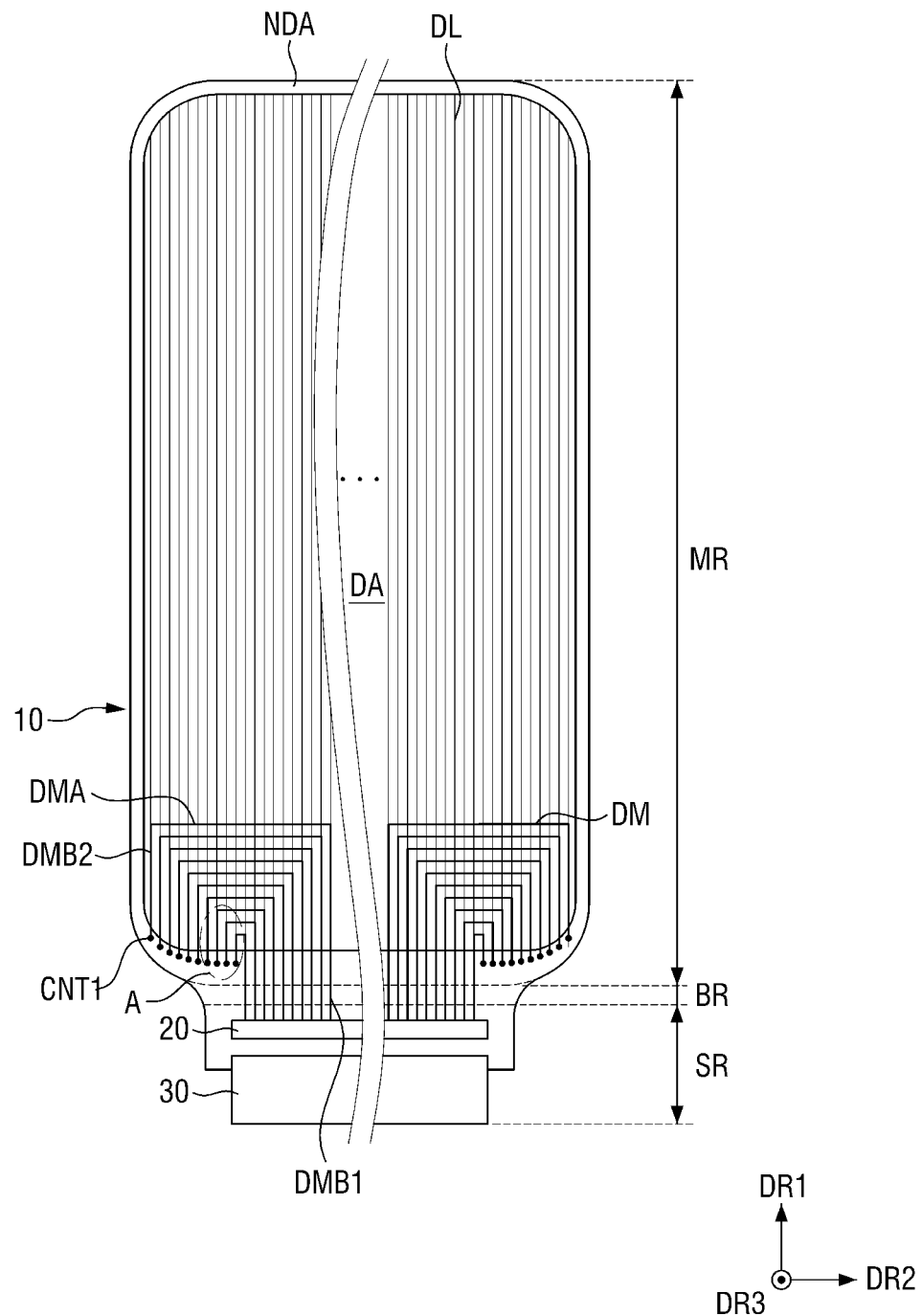
FIG. 3 shows a plan view showing signal lines and connection lines of a display device according to an embodiment.
Figure 4:
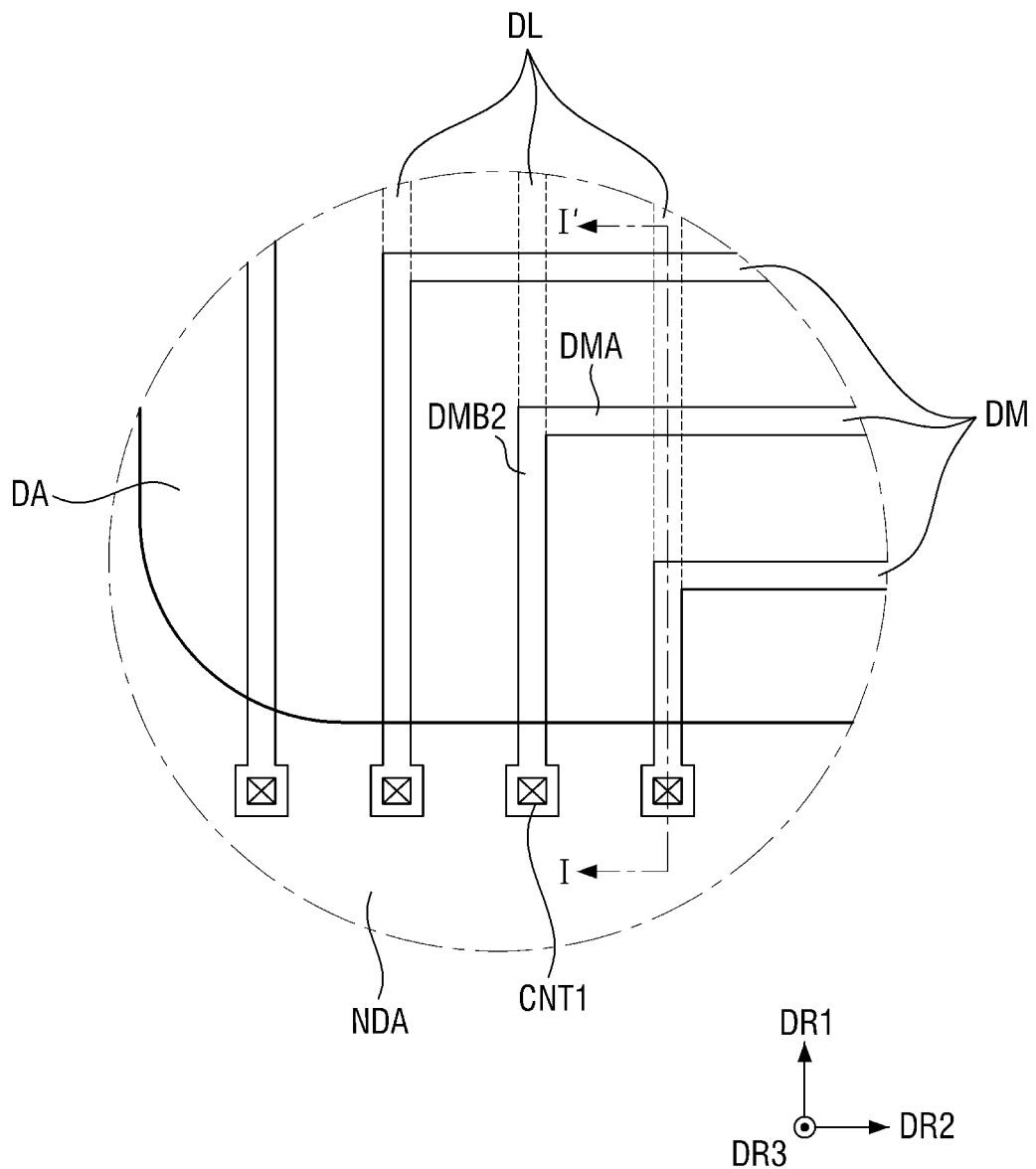
FIG. 4 shows an enlarged plan view of area A of FIG. 3.
Figure 5:
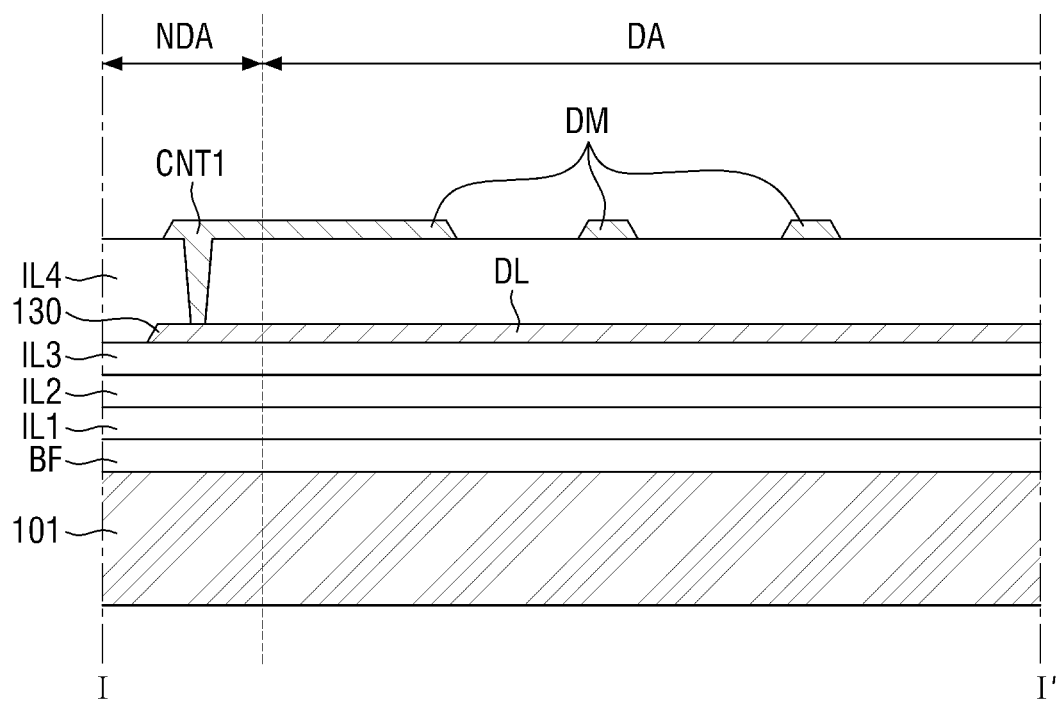
FIG. 5 shows a cross-sectional view taken along line I-I' of FIG. 4.

FIG. 3 shows a plan view showing signal lines and connection lines of a display device according to an embodiment. FIG. 4 shows an enlarged plan view of area A of FIG. 3. FIG. 5 shows a schematic cross-sectional view taken along line I-I' of FIG. 4.

Referring to FIGS. 3 to 5, the display device 1 may include signal lines DL and connection lines DM. The arrangement of the signal lines DL and the connection lines DM may be symmetrical with respect to a reference axis (not shown) extending in the first direction DR1 and passing through the center of the area of the display device 1. In the following description, the signal lines DL and the connection lines DM disposed on the left side of the display device 1 will be mainly described.

The signal lines DL may extend in the first direction DR1 and may be sequentially arranged at specific intervals along the second direction DR2. The second direction DR2 may intersect the first direction DR1 and may be perpendicular to the first direction DR1. The signal lines DL may be, for example, data lines transmitting data signals.

Each of the signal lines DL may extend across the display area DA in the first direction DR1. One end of the signal line DL may be disposed in the non-display area NDA. One end of the signal line DL may be electrically connected to the connection line DM.

The connection lines DM may be electrically connected to the signal lines DL, respectively. The connection lines DM may be disposed on a layer different from a layer on which the signal lines DL are disposed, and the connection lines DM may be insulated from the signal lines DL through an insulating layer, as will be described later with reference to FIG. 5.

The connection lines DM may extend from the non-display area NDA to the non-display area NDA via the display area DA. The connection lines DM may be separated from each other at predetermined intervals. The interval between the connection lines DM may be substantially equal to the interval between the signal lines DL.

Further, the connection lines DM may extend from the non-display area NDA in the first direction DR1 (for example, upward), and extend in the second direction DR2 (for example, to the left), such that they may switch direction in the display area DA. The connection line DM may extend to one end of the corresponding signal line DL in an area adjacent to or intersecting the corresponding signal line DL. For example, the connection line DM may extend to the non-display area NDA where one end of the signal line DL may be disposed.

Each of the connection lines DM may include a horizontal portion DMA disposed along the second direction DR2 and a vertical portion DMB disposed along the first direction DR1. The vertical portion DMB of the connection line DM may include a first vertical portion DMB1 and a second vertical portion DMB2 disposed along the first direction DR1. The horizontal portion DMA of the connection line DM extends in the second direction DR2 from one end of the first vertical portion DMB1, and the second vertical portion DMB2 extends from one end of the horizontal portion DMA in a direction opposite to extension of the first vertical portion DMB1 in the first direction DR1.

As shown in FIG. 4, the vertical portion DMB of the connection line DM may overlap the signal line DL in the display area DA in plan view. However, the disclosure may not be limited thereto. For example, the vertical portion DMB of the connection line DM may not overlap the signal line DL in the display area DA in plan view. For example, the vertical portion DMB of the connection line DM may be disposed in a space between a respective pair of signal lines DL.

Although FIGS. 3 and 4 show that the connection line DM is bent at a right angle, the disclosure may not be limited thereto.

The connection lines DM may not intersect each other in plan view and, thus, may be disposed to bypass other adjacent connection lines DM. Accordingly, the connection lines DM may have different lengths. For example, the length of the connection line DM disposed on a first side may be longer than the length of the connection line DM disposed on a second side thereof.

The connection lines DM, such as those shown in area A of FIG. 3, may be directly connected one-to-one to the signal lines DL through first contact holes CNT1 located in the non-display area NDA. For example, as shown in FIG. 5, the signal lines DL may be formed by a third conductive layer 130. In other words, the signal lines DL may be implemented by the third conductive layer 130, such that the third conductive layer 130 includes the signal lines DL that may thus be defined by the third conductive layer 130. The connection lines DM may be formed by a fourth conductive layer 140 (see FIG. 11). Similarly, the connection lines DM may be implemented by the fourth conductive layer 140, such that the fourth conductive layer 140 includes the connection lines DM that may thus be defined by the fourth conductive layer 140. The signal lines DL and the connection lines DM may be insulated by a fourth insulating layer IL4. A connection line DM may extend to one end of a signal line DL. The connection line DM may be electrically connected to the signal line DL through the first contact hole CNT1 which passes through the fourth insulating layer IL4 to expose one end of the signal line DL.

As described above, the display device 1 may include the connection lines DM disposed in portions of the display area DA, and an image signal may be provided to the signal lines DL via the connection lines DM. Therefore, a dead space that may be required to connect the signal lines DL to the driving chip 20 may be unnecessary. Herein, the term "dead space" may be understood as a space which is devoted to accommodating one or more components that, either singularly or plurally, perform an intended function. In other words, no dead space may be necessitated to connect the signal lines DL to the driving chip 20 since the image signal from the driving chip 20 may be provided to the signal lines DL through the connection lines DM. As a result, overall dead space of the display device, such as in either the display area and/or the non-display area NDA, may be reduced or its increase may be minimized or prevented.

Hereinafter, a relationship between the connection lines DM and the pixels P will be described in detail.

Figure 6:
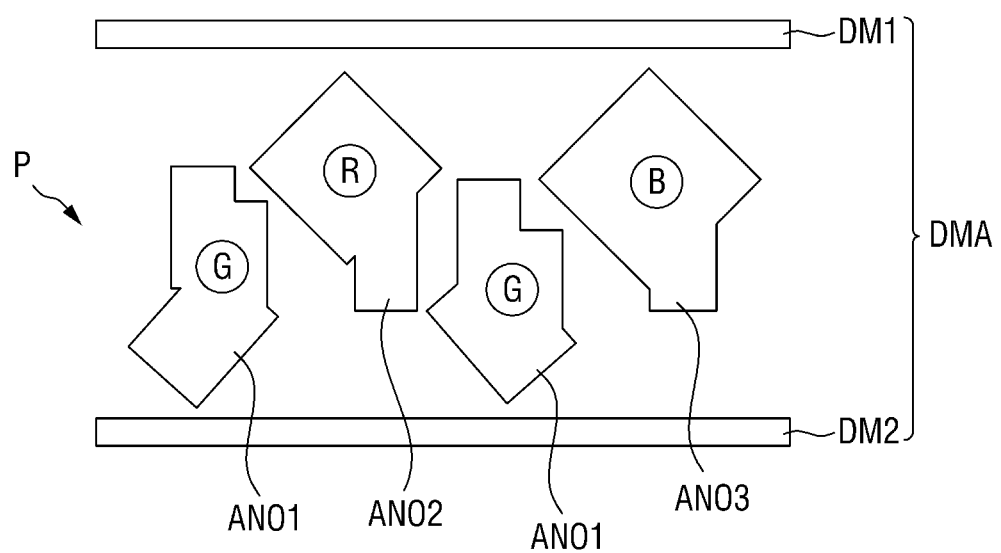
FIG. 6 shows a plan view showing the arrangement of connection lines and pixels according to an embodiment.
Figure 6:
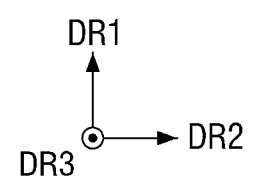
Figure 7:
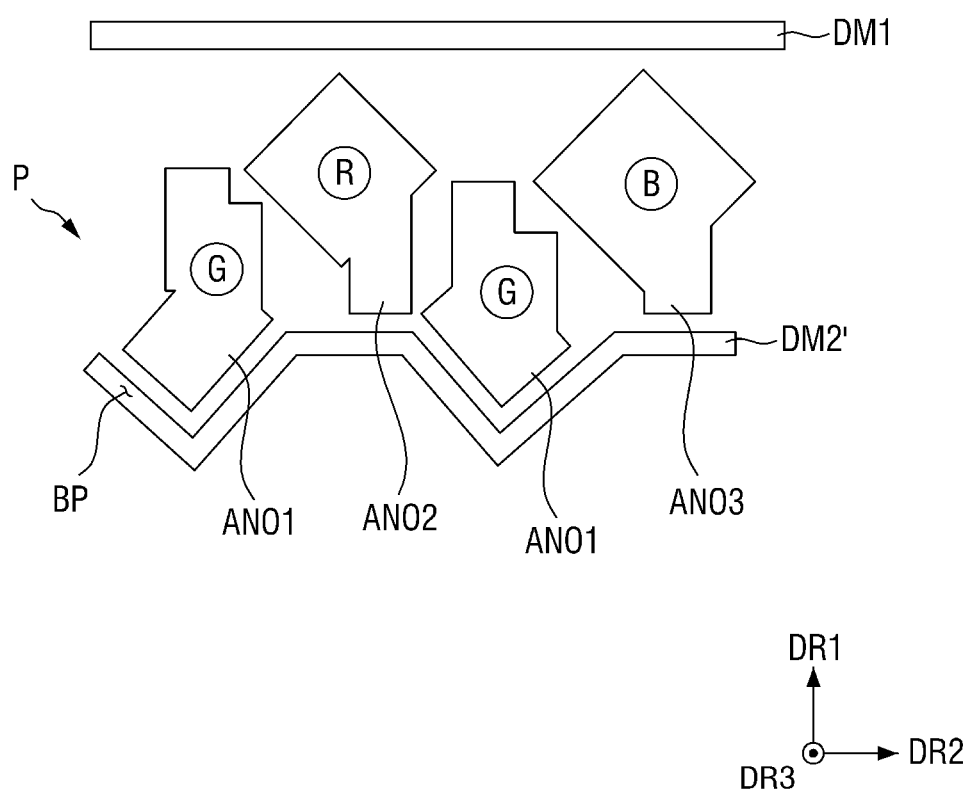
FIGS. 7 to 9 show plan views showing the arrangement of connection lines and pixels according to various embodiments.
Figure 8:
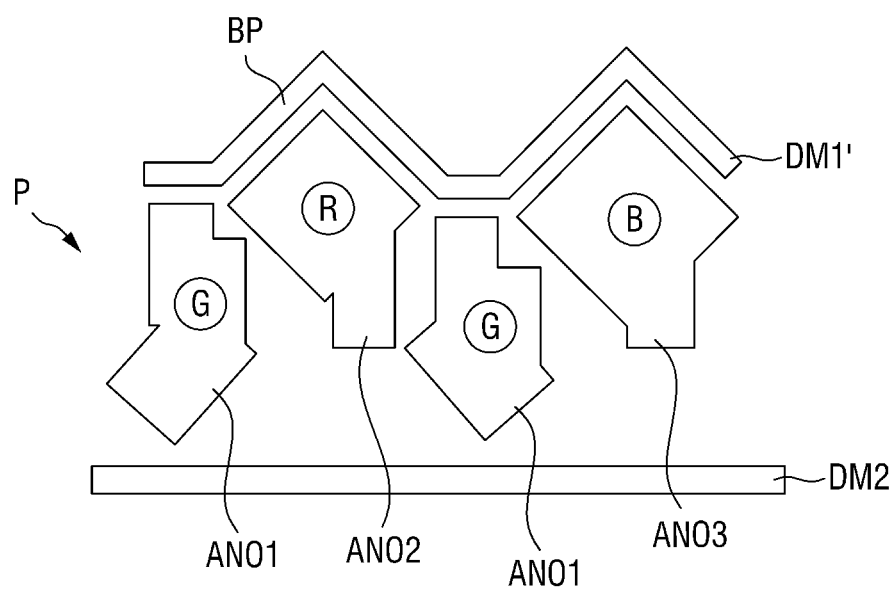
Figure 9:
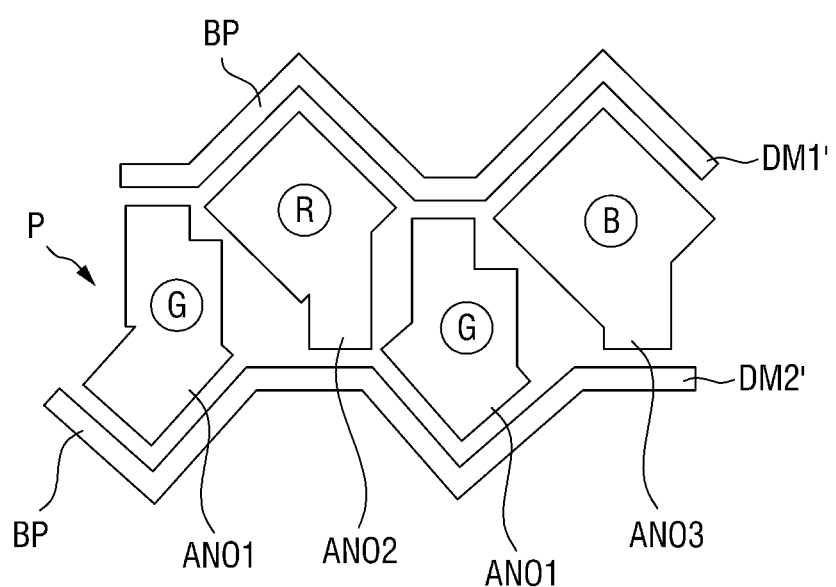
Figure 9:
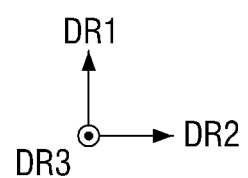

FIG. 6 shows a plan view showing the arrangement of connection lines and pixels according to an embodiment. FIGS. 7 to 9 show plan views showing the arrangement of connection lines and pixels according to various embodiments.

Referring to FIGS. 6 to 11, each pixel P may include sub-pixels R, G and B. The sub-pixels R, G and B may include a first sub-pixel R emitting light in a first color, a second sub-pixel G emitting light in a second color, and a third sub-pixel B emitting light in a third color. The first sub-pixel R may be a red sub-pixel, the second sub-pixel G may be a green sub-pixel and the third sub-pixel B may be a blue sub-pixel, but the disclosure may not be limited thereto. For example, one first sub-pixel R, two second sub-pixels G and one third sub-pixel B may be defined as one pixel P. The pixel P refers to a group of sub-pixels capable of expressing gradation. Although FIG. 6 illustrates that the second sub-pixel G, the first sub-pixel R, the second sub-pixel G and the third sub-pixel B may be sequentially arranged in the second direction DR2, the arrangement of the sub-pixels R, G and B may not be limited thereto.

The sub-pixels R, G and B may have different shapes and sizes. Although FIG. 6 illustrates that the third sub-pixel B may have the largest size and the second sub-pixel G may have the smallest size, the sizes of the sub-pixels R, G and B are not limited thereto.

Each of the sub-pixels R, G and B may be disposed between the horizontal portions DMA of the connection lines DM in plan view. The horizontal portions DMA may include a first horizontal portion DM1 of a first connection line DM and a second horizontal portion DM2 of a second connection line DM. The first horizontal portion DM1 and the second horizontal portion DM2, which may be portions of the first and second connection lines DM that are each connected to different signal lines DL, may be spaced apart from each other without intersecting each other. The first horizontal portion DM1 and the second horizontal portion DM2 may extend in the second direction DR2 and may be sequentially arranged at specific intervals along the first direction DR1. In other words, the first horizontal portion DM1 and the second horizontal portion may be spaced from each other according to an interval of spacing along the first direction DR1.

The first horizontal portion DM1 may be disposed on one side of the sub-pixels R, G and B, and the second horizontal portion DM2 may be disposed on the other side of the sub-pixels R, G and B. For example, the first horizontal portion DM1 may be disposed adjacent to one side of the sub-pixels R, G and B in the first direction DR1, and the second horizontal portion DM2 may be disposed adjacent to the other side of the sub-pixels R, G and B in the first direction DR1. The first horizontal portion DM1 and the second horizontal portion DM2 may be disposed so as not to overlap the sub-pixels R, G and B.

An anode electrode ANO may be disposed corresponding to each pixel P. The anode electrode ANO may be disposed between the horizontal portions DMA of the connection lines DM in plan view. For example, the anode electrode ANO may be disposed between the first horizontal portion DM1 and the second horizontal portion DM2 in plan view. The anode electrode ANO may be disposed so as not to overlap the first horizontal portion DM1 and the second horizontal portion DM2.

The anode electrode ANO may include first to third anode electrodes ANO1, ANO2 and ANO3 corresponding to the sub-pixels R, G and B, respectively. The first anode electrode ANO1 may be disposed corresponding to the second sub-pixel G, the second anode electrode ANO2 may be disposed corresponding to the first sub-pixel R, and the third anode electrode ANO3 may be disposed corresponding to the third sub-pixel B.

The horizontal portions DMA of the connection lines DM may be formed in a linear shape extending in the second direction DR2 as shown in FIG. 6, but may be partially deformed or bent.

As shown in FIGS. 7 to 9, one or more of the horizontal portions DMA may include a bent portion BP which is partially bent. For example, as shown in FIG. 7, the first horizontal portion DM1 may be formed in a linear shape extending in the second direction DR2, and a second horizontal portion DM2' may include the bent portion BP which is partially bent from the second direction DR2. The bent portion BP may be a region bent along the edge of the anode electrode ANO. For example, the bent portion BP may be disposed in parallel with a specific gap from the edge of the anode electrode ANO. The bent portion BP of the second horizontal portion DM2' may be bent along the edge of the first anode electrode ANO1 of the second sub-pixel G. For example, when the first anode electrode ANO1 includes an uneven portion, the bent portion BP of the second horizontal portion DM2' may be bent to one side from the second direction DR2, along the uneven portion of the first anode electrode ANO1, bent to the other side, and then restored in the second direction DR2. Because the second horizontal portion DM2' includes the bent portion BP, a distance between the second horizontal portion DM2' and the anode electrode ANO may be reduced. For example, the distance from the first horizontal portion DM1 to the second sub-pixel G may be greater than the distance from the second horizontal portion DM2' to the second sub-pixel G.

Further, as shown in FIG. 8, the second horizontal portion DM2 may be formed in a linear shape, and the first horizontal portion DM1' may include the bent portion BP. The bent portion BP of the first horizontal portion DM1' may be bent along the edge of the second anode electrode ANO2 of the first sub-pixel R. Further, the bent portion BP of the first horizontal portion DM1' may be bent along the edge of the third anode electrode ANO3 of the third sub-pixel B. Because the first horizontal portion DM1' includes the bent portion BP, a distance between the first horizontal portion DM1' and the anode electrode ANO may be reduced. For example, a distance from the first horizontal portion DM1' to the first sub-pixel R may be greater than a distance from the second horizontal portion DM2 to the first sub-pixel R. Further, a distance from the first horizontal portion DM1' to the third sub-pixel B may be greater than a distance from the second horizontal portion DM2 to the third sub-pixel B. However, the disclosure is not limited to the embodiments shown in FIGS. 7 and 8, and both of the first horizontal portion DM1' and the second horizontal portion DM2' may include the bent portion BP as shown in FIG. 9.

Hereinafter, the structure of the pixel P will be described in more detail.

Figure 10:
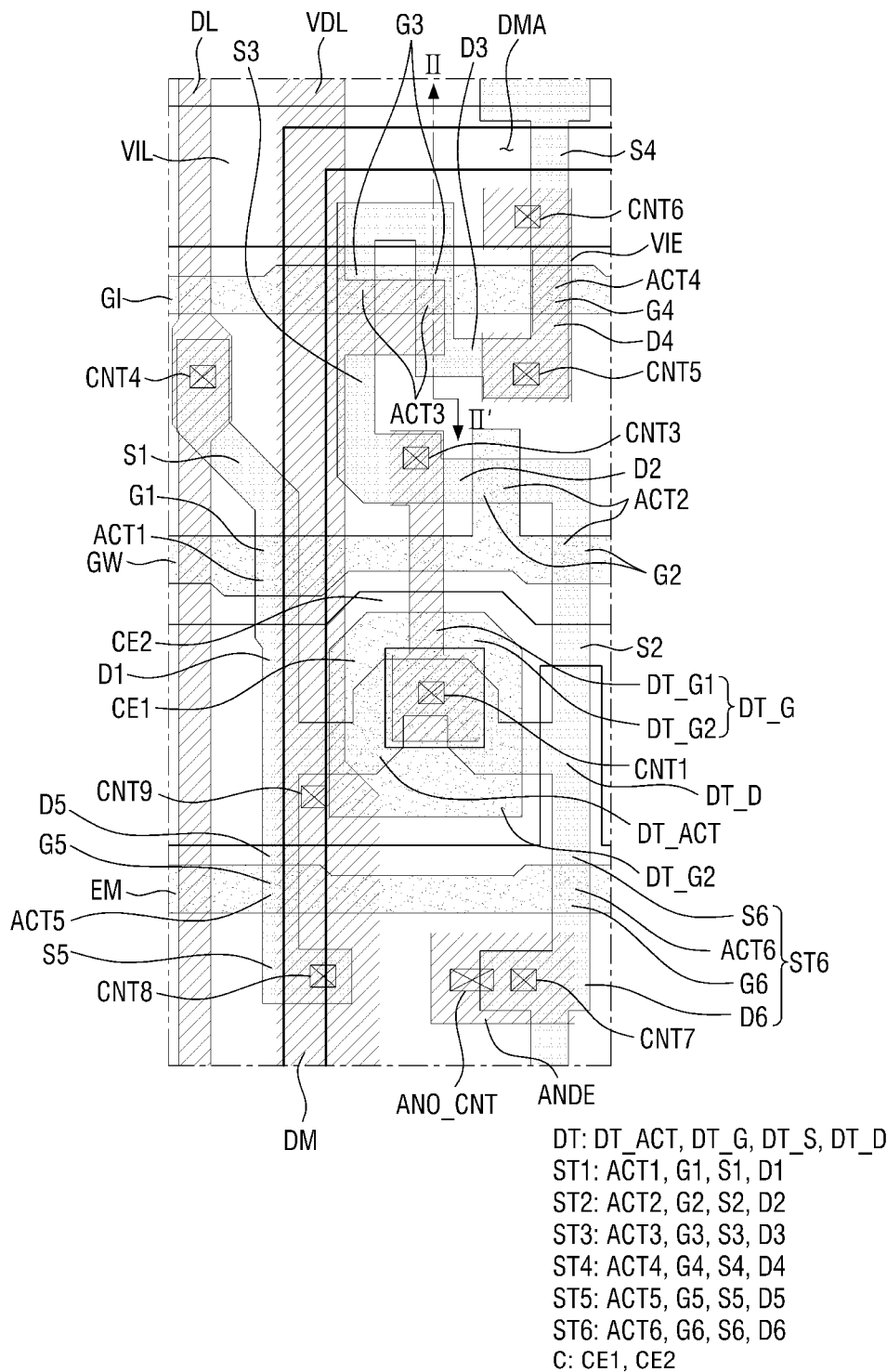
FIG. 10 shows a plan view showing a schematic diagram of an equivalent circuit of a pixel.

FIG. 10 shows a plan view showing a schematic diagram of an equivalent circuit of a pixel according to an embodiment.

Referring to FIG. 10, the pixel P may further include a first scan line GI, a second scan line GW, an emission control line EM, an initialization voltage line VIL and a first source voltage line VDL.

The first scan line GI may transmit a first scan signal, the second scan line GW may transmit a second scan signal, and the emission control line EM may transmit an emission control signal. The first scan line GI, the second scan line GW and the emission control line EM may be arranged along the second direction DR2 in plan view. The second scan line GW may be disposed between the first scan line GI and the emission control line EM in plan view.

The initialization voltage line VIL may transmit an initialization voltage. The initialization voltage line VIL may be disposed along the second direction DR2 in plan view. The initialization voltage line VIL may be disposed on, i.e., adjacent to, one side of the first scan line GI in plan view, but the disclosure is not limited thereto.

The signal line DL may transmit a data signal, and may be disposed along the first direction DR1 in plan view to intersect the first scan line GI, the second scan line GW, the emission control line EM and the initialization voltage line VIL.

The first source voltage line VDL may transmit a driving voltage and may be disposed on, i.e., adjacent to one side of the signal line DL. The first source voltage line VDL may be disposed along the first direction DR1 in plan view to intersect the first scan line GI, the second scan line GW, the emission control line EM and the initialization voltage line VIL.

The connection line DM may be disposed along the first direction DR1 or the second direction DR2 to partially overlap the initialization voltage line VIL. The horizontal portion DMA of the connection line DM may be disposed along the second direction DR2 to overlap the initialization voltage line VIL. Accordingly, it may be possible to prevent coupling between the connection line DM and another line, and a detailed description thereof will be given later.

Each pixel P may include a capacitor C and transistors DT and ST1 to ST6 connected to the first scan line GI, the second scan line GW, the emission control line EM, the signal line DL, the initialization voltage line VIL, the first source voltage line VDL.

Although FIG. 10 shows that the pixel P includes seven transistors DT and ST1 to ST6 and one capacitor C1, the disclosure is not limited thereto.

The driving transistor DT may include a driving channel region DT_ACT, a driving gate electrode DT_G, a driving source region DT_S and a driving drain region DT_D. The driving channel region DT_ACT may overlap the driving gate electrode DT_G. The driving gate electrode DT_G may include a first driving gate electrode DT_G1 and a second driving gate electrode DT_G2. The second driving gate electrode DT_G2 may be disposed on the first driving gate electrode DT_G1, and the first driving gate electrode DT_G1 and the second driving gate electrode DT_G2 may be connected to each other through a second contact hole CNT2. The first driving gate electrode DT_G1 may overlap the driving channel region DT_ACT, and the second driving gate electrode DT_G2 may be connected to a drain region D2 of a second switching transistor ST2 through a third contact hole CNT3. The driving source region DT_S may be connected to a drain region D1 of a first switching transistor ST1. The driving drain region DT_D may be connected to a source region S2 of the second switching transistor ST2 and a source region S6 of a sixth switching transistor ST6.

The first switching transistor ST1 may include a first channel region ACT1, a first gate electrode G1, a first source region S1 and a first drain region D1. The first gate electrode G1 may be a portion of the second scan line GW and may be an overlapping region of the first channel region ACT1 and the second scan line GW. The first source region S1 may be connected to the signal line DL through a fourth contact hole CNT4. The first drain region D1 may be connected to the source region DT_S of the driving transistor DT.

The second switching transistor ST2 may include a second channel region ACT2, a second gate electrode G2, a second source region S2 and a second drain region D2. The second switching transistor ST2 may be turned on in response to the second scan signal received through the second scan line GW to diode-couple the driving transistor DT. The second gate electrode G2 may be a portion of the second scan line GW and may be an overlapping region of the second channel region ACT2 and the second scan line GW. The second source region S2 may be connected to the drain region DT_D of the driving transistor DT. The second drain region D2 may be connected to the gate electrode DT_G of the driving transistor DT.

The second switching transistor ST2 may be a dual transistor. For example, the second switching transistor ST2 may include two second channel regions ACT2 and two second gate electrodes G2 as shown in FIG. 10.

The third switching transistor ST3 may include a third channel region ACT3, a third gate electrode G3, a third source region S3 and a third drain region D3. The third switching transistor ST3 may be turned on in response to the first scan signal received through the first scan line GI to transmit the initialization voltage to the gate electrode DT_G of the driving transistor DT, and may perform an initialization operation for initializing the gate voltage of the driving transistor DT. The third gate electrode G3 may be a portion of the first scan line GI and may be an overlapping region of the third channel region ACT3 and the first scan line GI. The third source region S3 may be connected to the gate electrode DT_G of the driving transistor DT and the drain region D2 of the second switching transistor ST2. The third drain region D3 may be connected to the initialization voltage line VIL through a fifth contact hole CNT5.

The third switching transistor ST3 may be a dual transistor. For example, the third switching transistor ST3 may include two third channel regions ACT3 and two third gate electrodes G3 as shown in FIG. 10.

The fourth switching transistor ST4 may include a fourth channel region ACT4, a fourth gate electrode G4, a fourth source region S4 and a fourth drain region D4. The fourth gate electrode G4 may be a portion of the first scan line GI and may be an overlapping region of the fourth channel region ACT4 and the first scan line GI. The fourth source region S4 may be connected to an anode electrode (not shown) of an organic light emitting element. The fourth drain region D4 may be connected to the initialization voltage line VIL through the fifth contact hole CNT5.

The initialization voltage line VIL may be connected to an initialization connection electrode VIE through a sixth contact hole CNT6, and the initialization connection electrode VIE may be connected to the drain region D3 of the third switching transistor ST3 through the fifth contact hole CNT5. The initialization connection electrode VIE may be disposed to intersect the first scan line GI. Further, the anode electrode (not shown) may be connected to an anode connection electrode ANDE through an anode contact hole ANO_CNT, and the anode connection electrode ANDE may be connected to the source region S4 of the fourth switching transistor ST4 through a seventh contact hole CNT7.

The fifth switching transistor ST5 may include a fifth channel region ACT5, a fifth gate electrode G5, a fifth source region S5 and a fifth drain region D5. The fifth gate electrode G5 may be a portion of the emission control line EM and may be an overlapping region of the fifth channel region ACT5 and the emission control line EM. The fifth source region S5 may be connected to the source region DT_S of the driving transistor DT and the drain region D1 of the first switching transistor ST1. The fifth drain region D5 may be connected to the first source voltage line VDL through an eighth contact hole CNT8.

The sixth switching transistor ST6 may include a sixth channel region ACT6, a sixth gate electrode G6, a sixth source region S6 and a sixth drain region D6. The sixth gate electrode G6 may be a portion of the emission control line EM and may be an overlapping region of the sixth channel region ACT6 and the emission control line EM. The sixth source region S6 may be connected to the drain region DT_D of the driving transistor DT and the source region S2 of the second switching transistor ST2. The sixth drain region D6 may be connected to the anode electrode (not shown) of the organic light emitting element. The fifth switching transistor ST5 and the sixth switching transistor ST6 may be simultaneously turned on in response to the emission control signal received through the emission control line EM to cause a current to flow through the organic light emitting element.

A first electrode CE1 of the capacitor C1 may be substantially identical to the gate electrode DT_G of the driving transistor DT, and a second electrode CE2 of the capacitor C1 may overlap the gate electrode DT_G of the driving transistor DT and may be connected to the first source voltage line VDL through a ninth contact hole CNT9.

Hereinafter, a cross-sectional structure of the pixel P will be described in detail.

Figure 11:
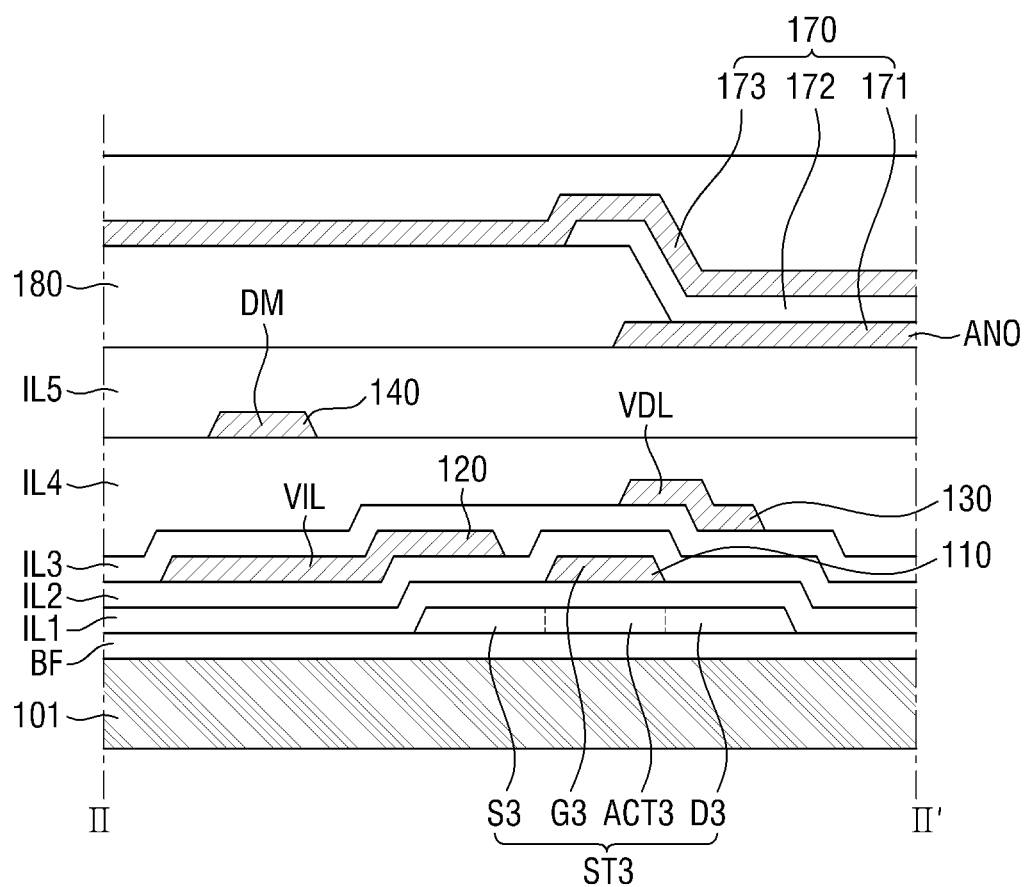
FIG. 11 shows a cross-sectional view taken along line II-II' of FIG. 10.

FIG. 11 shows a cross-sectional view taken along line II-II' of FIG. 10.

Referring to FIG. 11, each pixel P may include a substrate 101, a buffer layer BF, a semiconductor layer ACT, a first insulating layer ILL a first conductive layer 110, a second insulating layer IL2, a second conductive layer 120, a third insulating layer IL3, a third conductive layer 130, a fourth insulating layer IL4, a fourth conductive layer 140, a fifth insulating layer IL5, a first electrode layer 171, a pixel defining layer 180 including an opening to expose the first electrode layer 171, an organic layer 172 disposed in the opening of the pixel defining layer 180, and a second electrode layer 173 disposed on the organic layer 172 and the pixel defining layer 180.

Each of the layers described above may consist of a single layer, or a stack of multiple layers. Other layers may be further disposed between the layers.

The substrate 101 may support the respective layers disposed thereon. The substrate 101 may be formed of an insulating material such as a polymer resin. Examples of the polymeric material may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. The substrate 101 may be a flexible substrate which may be bent, folded or rolled. An example of the material of the flexible substrate may be polyimide (PI), but is not limited thereto. The substrate 101 may be a rigid substrate made of glass, quartz, or the like.

The buffer layer BF may be disposed on the substrate 101. The buffer layer BF may prevent diffusion of impurity ions, prevent penetration of moisture or external air, and perform a surface planarization function. The buffer layer BF may include silicon nitride, silicon oxide, silicon oxynitride, or the like.

The semiconductor layer ACT may be disposed on the buffer layer BF. The semiconductor layer ACT may form channels of the first to sixth switching transistors ST1 to ST6 and the driving transistor DT of the pixel P. The semiconductor layer ACT may include polycrystalline silicon. The polycrystalline silicon may be formed by crystallizing amorphous silicon.

In a case that the semiconductor layer ACT is made of polycrystalline silicon and the semiconductor layer ACT may be doped with ions, the ion-doped semiconductor layer ACT may have conductivity. Accordingly, the semiconductor layer ACT may include source regions and drain regions as well as channel regions of the driving transistor DT and the first to sixth switching transistors ST1 to ST6. For example, the semiconductor layer ACT may include the driving channel region DT_ACT of the driving transistor DT and the first to sixth channel regions ACT1 to ACT6 of the first to sixth switching transistors ST1 to ST6. Further, the semiconductor layer ACT may include the driving source region DT_S and the driving drain region DT_D located on both sides of the driving channel region DT_ACT, and the first to sixth source regions S1 to S6 and the first to sixth drain regions D1 to D6 located on both sides of the first to sixth channel regions ACT1 to ACT6.

The source regions DT_S and S1 to S6 and the drain regions DT_D and D1 to D6 may be connected to both sides of the respective channel regions DT_ACT and ACT1 to ACT6 in plan view.

In another embodiment, the semiconductor layer ACT may include monocrystalline silicon, low-temperature polycrystalline silicon, amorphous silicon, or an oxide semiconductor. The oxide semiconductor may include, for example, a binary compound (ABx), a ternary compound (ABxCy), or a quaternary compound (ABxCyDz) including indium, zinc, gallium, tin, titanium, aluminum, hafnium (Hf), zirconium (Zr), magnesium (Mg) and the like. In one embodiment, the semiconductor layer ACT may include ITZO (an oxide including indium, tin and titanium) or IGZO (an oxide including indium, gallium and tin).

The first insulating layer IL1 may be disposed on the semiconductor layer ACT. The first insulating layer IL1 may be disposed substantially over the entire surface of the substrate 101. The first insulating layer IL1 may be a gate insulating layer having a gate insulating function. The first insulating layer IL1 may include a silicon compound, a metal oxide, or the like. For example, the first insulating layer IL1 may include silicon oxide, silicon nitride, silicon oxynitride, aluminum oxide, tantalum oxide, hafnium oxide, zirconium oxide, titanium oxide, or the like. The first insulating layer IL1 may be a single layer or a multilayer stack of different materials.

The first conductive layer 110 may be disposed on the first insulating layer IL1. The first conductive layer 110 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The first conductive layer 110 may be a single layer or a multilayer.

The first scan line GI, the second scan line GW and the emission control line EM may be formed by the first conductive layer 110. In other words, the first scan line GI, the second scan line GW and the emission control line EM may be implemented by the first conductive layer 110, such that the first conductive layer 110 includes the first scan line GI, the second scan line GW and the emission control line EM that may thus be defined by the first conductive layer 110. Further, each of the first driving gate electrode DT_G1 of the driving transistor DT and the first to sixth gate electrodes G1 to G6 of the first to sixth switching transistors ST1 to ST6 may be similarly implemented by the first conductive layer 110 as a portion of either the first scan line GI or the second scan line GW.

The second insulating layer IL2 may be disposed on the first conductive layer 110. The second insulating layer IL2 may be disposed substantially over the entire surface of the substrate 101. The second insulating layer IL2 may insulate the first conductive layer 110 from the second conductive layer 120.

The second insulating layer IL2 may be an interlayer insulating layer. The second insulating layer IL2 may include the same material as the first insulating layer IL1 or may include one or more materials selected from the materials exemplified as the constituent materials of the first insulating layer IL1.

The second conductive layer 120 may be disposed on the second insulating layer IL2. The initialization voltage line VIL and the second gate electrode DT_G2 of the driving transistor DT may be formed by the second conductive layer 120. In other words, the initialization voltage line VIL and the second gate electrode DT_G2 may be implemented by the second conductive layer 10, such that the second conductive layer 120 includes the initialization voltage line VIL and the second gate electrode DT_G2 that may thus be defined by the second conductive layer 120.

The second conductive layer 120 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The second conductive layer 120 may be formed from the same material as the first conductive layer 110, but may not be limited thereto. The second conductive layer 120 may be a single layer or a multilayer.

The third insulating layer IL3 may cover the second conductive layer 120. The third insulating layer IL3 may insulate the second conductive layer 120 from the third conductive layer 130. The third insulating layer IL3 may include the same material as the first insulating layer IL1 or may include one or more materials selected from the materials exemplified as the constituent materials of the first insulating layer IL1.

The third conductive layer 130 may be disposed on the third insulating layer IL3. The third conductive layer 130 may include at least one metal selected from the group consisting of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The third conductive layer 130 may be a single layer or a multilayer. For example, the third conductive layer 130 may have a stacked structure of Ti/Al/Ti, Mo/Al/Mo, Mo/AlGe/Mo, or Ti/Cu.

The third conductive layer 130 may include the signal line DL and the first source voltage line VDL.

The fourth insulating layer IL4 may cover the third conductive layer 130. The fourth insulating layer IL4 may be a via layer. A bending insulating layer IL0 may include an organic insulating material selected from the group consisting of acrylic resin, epoxy resin, phenolic resin, polyamide resin, polyimide resin, unsaturated polyester resin, polyphenylene resin, polyphenylenesulfide resin and benzocyclobutene (BCB).

The fourth conductive layer 140 may be disposed on the fourth insulating layer IL4. The fourth conductive layer 140 may include the same material as the third conductive layer 130 or may include one or more materials selected from the materials exemplified as the constituent materials of the third conductive layer 130.

The fourth conductive layer 140 may include the connection line DM. The horizontal portion DMA of the connection line DM may be disposed so as not to overlap the first scan line GI. For example, the horizontal portion DMA of the connection line DM may be offset from the first scan line GI. Further, the horizontal portion DMA may be disposed to overlap the initialization voltage line VIL. The horizontal portion DMA may completely overlap the initialization voltage line VIL in the thickness direction.

In a case that the horizontal portion DMA of the connection line DM may overlap or face the first scan line GI, a data signal may be distorted due to the coupling between the connection line DM and the first scan line GI.

In a case that the same scan signal is supplied to the first scan line GI of one pixel and the second scan line GW of another pixel and the connection line DM disposed in one pixel is connected to the signal line DL of the other pixel, a data signal may be distorted due to the coupling between the horizontal portion DMA of the connection line DM disposed in one pixel and the first scan line GI. The distorted data signal may be written in the signal line DL of the other pixel as a result. Accordingly, a luminance difference between one pixel and the other pixel may occur, which may cause non-uniformity in luminance.

Therefore, it would be beneficial to prevent the aforementioned distortion and resulting luminance difference among pixels which may be caused by a case in which the connection line DM and the first scan line GI may be coupled.

Thus, the display device 1 according to an embodiment of the disclosure may be configured such that the horizontal portion DMA of the connection line DM does not overlap the first scan line GI. That is, the embodiment may be configured such that the horizontal portion DMA of the connection line DM may be offset from the first scan line so as to not overlap or face the first scan line GI. Accordingly, it may be possible to prevent parasitic capacitance from being formed between the horizontal portion DMA of the connection line DM and the first scan line GI. The initialization voltage line VIL may be disposed between the connection line DM and the first scan line GI to overlap or face the connection line DM, thereby minimizing or preventing a coupling phenomenon between the two lines, i.e., the connection line DM and first scan line GI. Because of such a lack of coupling, it may possible to prevent both a data signal from being distorted and the resulting non-uniformity in luminance among pixels. The display quality of an image to be displayed may therefore be improved in comparison to the above described instance in which coupling of the connection line DM and the first scan line GI may occur.

The fifth insulating layer IL5 may cover the fourth conductive layer 140. The fifth insulating layer IL5 may be a via layer. The fifth insulating layer IL5 may include the same material as the fourth insulating layer IL4 or may include one or more materials selected from the materials exemplified as the constituent materials of the fourth insulating layer IL4.

The first electrode layer 171 may be disposed on the fifth insulating layer IL5. The first electrode layer 171 may have a stacked structure formed by stacking a material layer having a high work function, such as indium tin oxide (ITO), indium zinc oxide (IZO), zinc oxide (ZnO) and indium oxide ($In_2O_3$), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a mixture thereof, but is not limited thereto. The first electrode layer 171 having a high work function may be disposed above the reflective material layer and disposed closer to the organic layer 172. The first electrode layer 171 may have a multilayer structure such as ITO/Mg, ITO/MgF, ITO/Ag and ITO/Ag/ITO, but may not be limited thereto.

The anode electrode ANO of the pixel P may be formed by the first electrode layer 171. In other words, the anode electrode ANO may be implemented by the first electrode layer 171, such that the first electrode layer 171 includes the anode electrode ANO that may thus be defined by the first electrode layer 171. The anode electrode ANO may be disposed so as not to overlap or face the horizontal portion DMA of the connection line DM. For example, the anode electrode may be offset from the horizontal portion DMA of the connection line DM. Thus, it may be possible to prevent non-uniformity in luminance due to the above-described coupling phenomenon.

The pixel defining layer 180 may be disposed on the first electrode layer 171. The pixel defining layer 180 may include an opening exposing the first electrode layer 171. The pixel defining layer 180 may be formed of an inorganic insulating material such as silicon oxide, silicon nitride, silicon oxynitride, hafnium oxide, aluminum oxide, titanium oxide, tantalum oxide and zinc oxide, or an organic insulating material such as acrylic resin, epoxy resin, phenolic resin, polyamide resin, polyimide resin, unsaturated polyester resin, polyphenylene resin, polyphenylenesulfide resin and benzocyclobutene (BCB). The pixel defining layer 180 may be a single layer or a multilayer stack of different materials.

The organic layer 172 may be disposed in the opening of the pixel defining layer 180. The organic layer 172 may include an organic light emitting layer, a hole injecting/transporting layer, and an electron injecting/transporting layer.

The second electrode layer 173 may be disposed on the organic layer 172 and the pixel defining layer 180. A cathode electrode CAT may be formed of the second electrode layer 173. In other words, the cathode electrode CAT may be implemented by the second electrode layer 173, such that the second electrode layer includes the cathode electrode CAT that may thus be defined by the second electrode layer. The cathode electrode CAT may be disposed over the entire display area. The second electrode layer 173 may include a material layer having a low work function, such as Li, Ca, LiF/Ca, LiF/Al, Al, Mg, Ag, Pt, Pd, Ni, Au Nd, Ir, Cr, BaF, Ba or a compound or mixture thereof (e.g., a mixture of Ag and Mg). The second electrode layer 173 may further include a transparent metal oxide layer disposed on the material layer having a low work function.

As described above, in a case that the display device 1 may be configured such that the horizontal portion DMA of the connection line DM does not overlap, e.g., is offset from, the first scan line GI, it may be possible to prevent parasitic capacitance from being formed between the horizontal portion DMA of the connection line DM and the first scan line GI. The initialization voltage line VIL may be disposed between the connection line DM and the first scan line GI to overlap and face the connection line DM, thereby minimizing or preventing a coupling phenomenon between the two lines. That is, it may be possible to prevent both the data signal from being distorted and any resulting non-uniformity in luminance among pixels.

Figure 12:
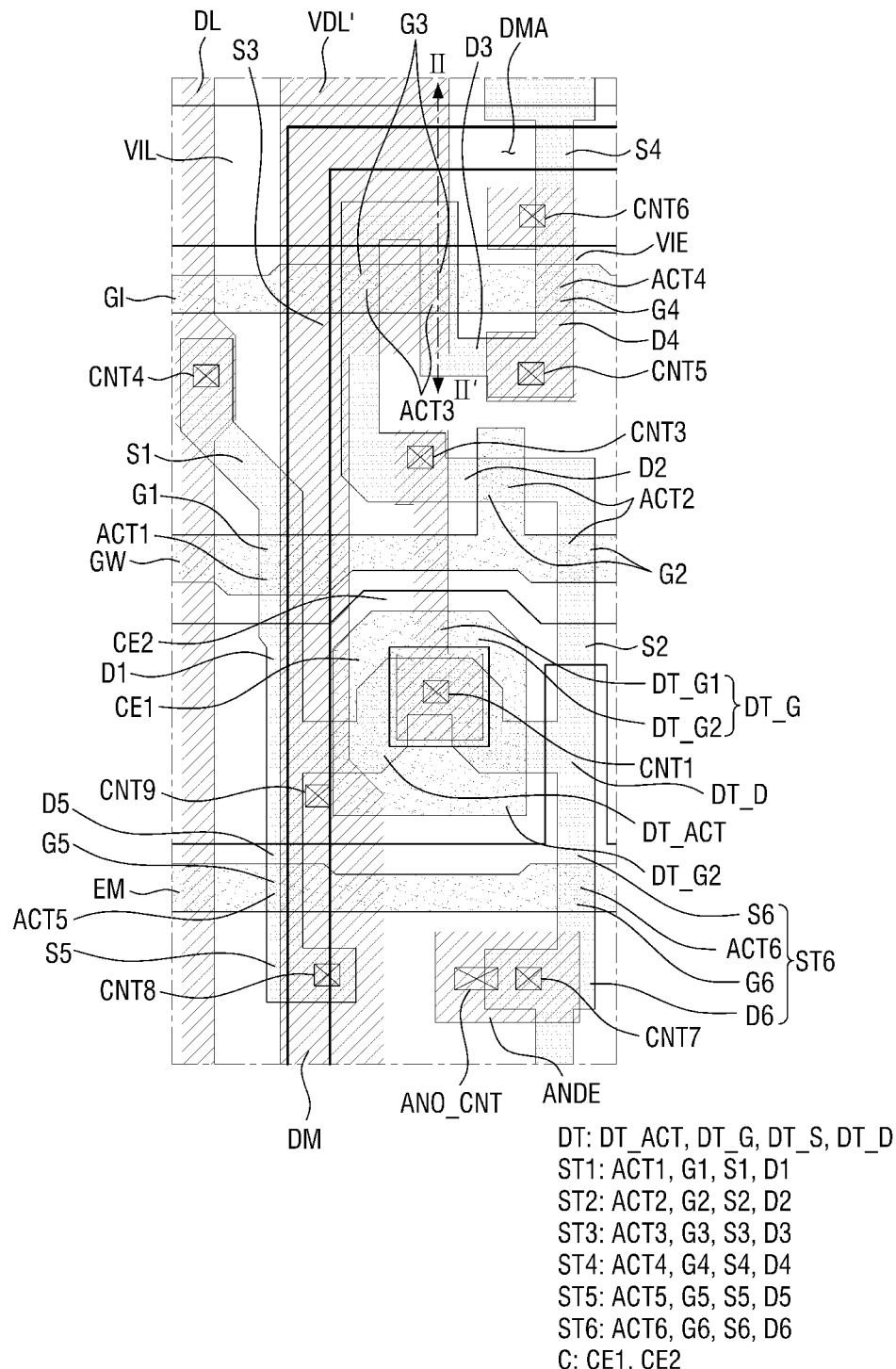
FIG. 12 shows a plan view showing a schematic diagram of an equivalent circuit of a pixel according to another embodiment.
Figure 13:
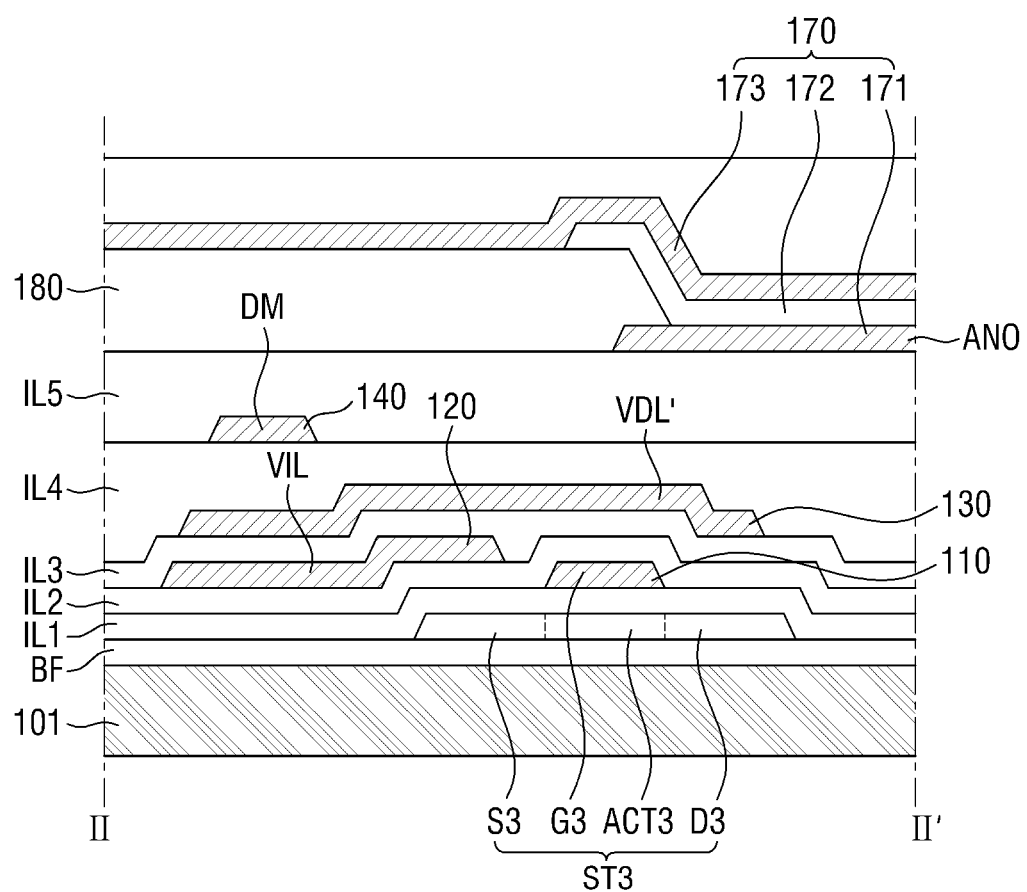
FIG. 13 show a cross-sectional view taken along line II-II' of FIG. 12.

FIG. 12 shows a plan view showing a schematic diagram of an equivalent circuit of a pixel according to another embodiment. FIG. 13 shows a schematic cross-sectional view taken along line II-II' of FIG. 12.

Referring to FIGS. 12 and 13, the embodiment may differ from the embodiment of FIGS. 10 and 11 in that a first source voltage line VDL' may extend to overlap the horizontal portion DMA of the connection line DM.

The first source voltage line VDL' may be disposed between the connection line DM and the first scan line GI to overlap and face the horizontal portion DMA of the connection line DM and the first scan line GI. For example, the first source voltage line VDL' may overlap and face the horizontal portion DMA of the connection line DM in the thickness direction. Further, the first source voltage line VDL' may be disposed to overlap and face the first scan line GI in the thickness direction. That is, the first source voltage line VDL' may be disposed between both the horizontal portion DMA of the connection line DM and the first scan line GI when viewed in the thickness direction. Thus, it may be possible to effectively prevent coupling between the horizontal portion DMA of the connection line DM and the first scan line GI.

Figure 14:
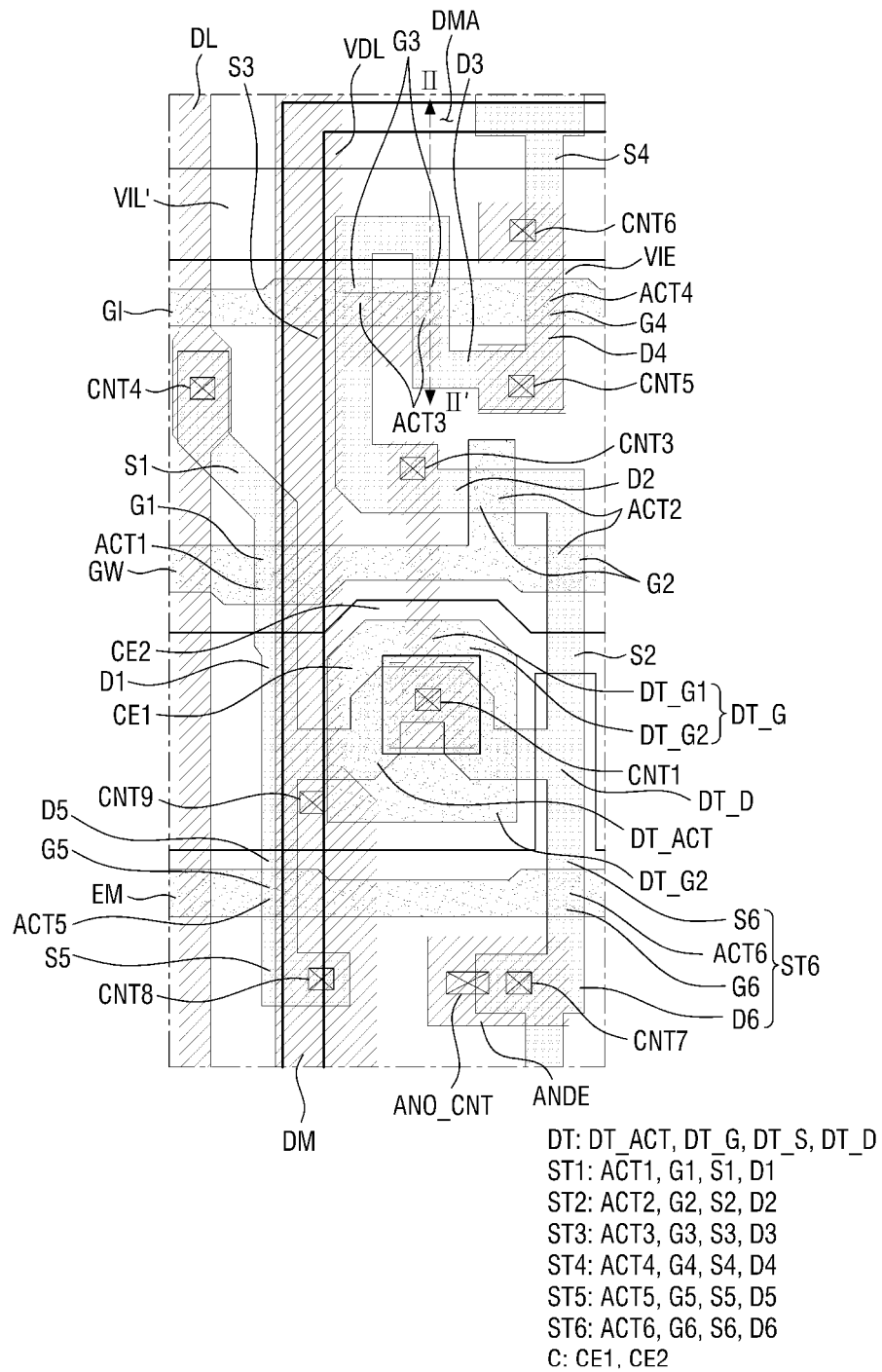
FIG. 14 shows a plan view showing a schematic diagram of an equivalent circuit of a pixel according to still another embodiment.
Figure 15:
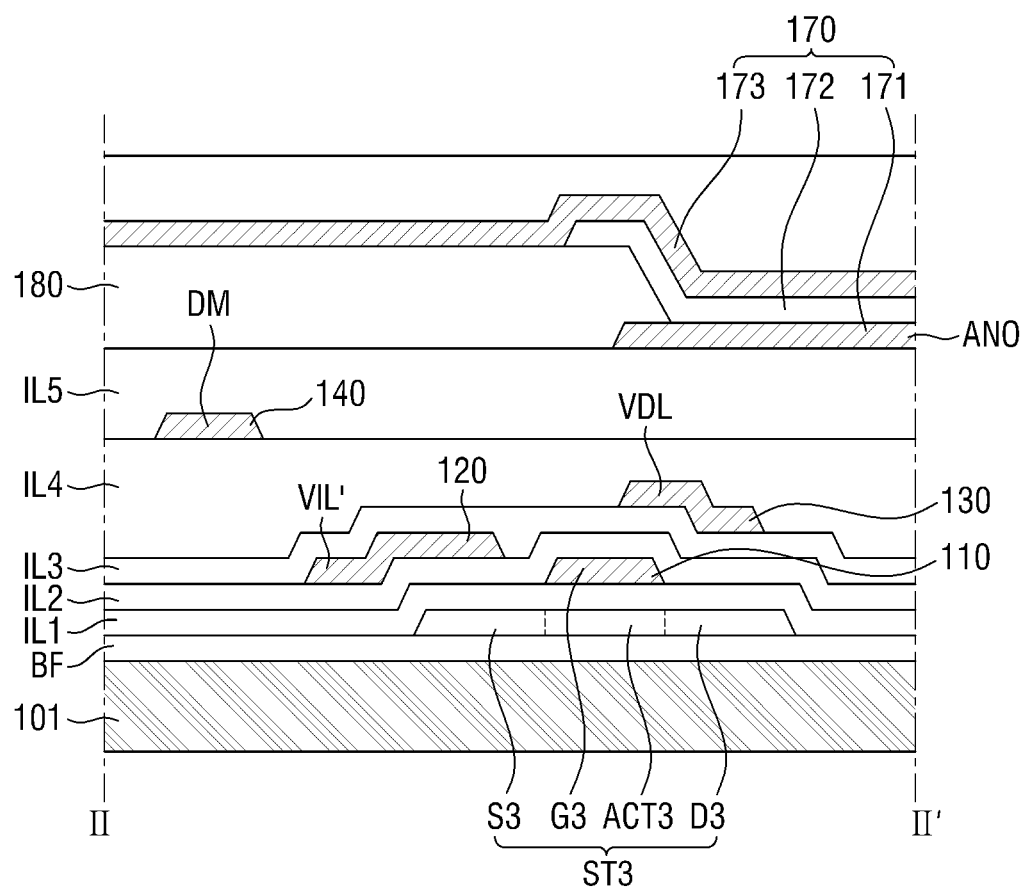
FIG. 15 shows a schematic cross-sectional view taken along line II-II' of FIG. 14.

FIG. 14 shows a plan view showing a schematic diagram of an equivalent circuit of a pixel according to still another embodiment. FIG. 15 is a schematic cross-sectional view taken along line II-II' of FIG. 14.

Referring to FIGS. 14 and 15, the embodiment thereof may differ from the embodiment of FIGS. 10 and 11 in that an initialization voltage line VIL' may be disposed between the horizontal portion DMA of the connection line DM and the first scan line GI in plan view.

The horizontal portion DMA of the connection line DM and the first scan line GI may be spaced apart from each other, and the initialization voltage line VIL' may be disposed in a space between the horizontal portion DMA of the connection line DM and the first scan line GI. For example, the horizontal portion DMA of the connection line DM may be disposed adjacent a side of the initialization voltage line VIL' such that the horizontal portion DMA of the connection line DM and the first scan line GI do not overlap each other, and the first scan line GI may be disposed adjacent another side of the initialization voltage line VIL'. Thus, the horizontal portion DMA of the connection line DM and the first scan line GI may not overlap each other since they may each be offset from each other and offset from the initialization voltage line VIL'. In other words, the initialization voltage line VIL' may be disposed between the horizontal portion DMA of the connection line DM and the first scan line GI and may be spaced from each thereof when viewed in the thickness direction. Thus, it may be possible to prevent coupling between the horizontal portion DMA of the connection line DM and the first scan line GI, thereby improving the display quality of an image to be displayed, as described above.

Though FIGS. 14 and 15 show a case where the horizontal portion DMA of the connection line DM may be disposed so as not to overlap the initialization voltage line VIL' in the thickness direction, the present disclosure may not be limited thereto. That is, the horizontal portion DMA of the connection line DM may be disposed to partially overlap the initialization voltage line VIL'.

Figure 16:
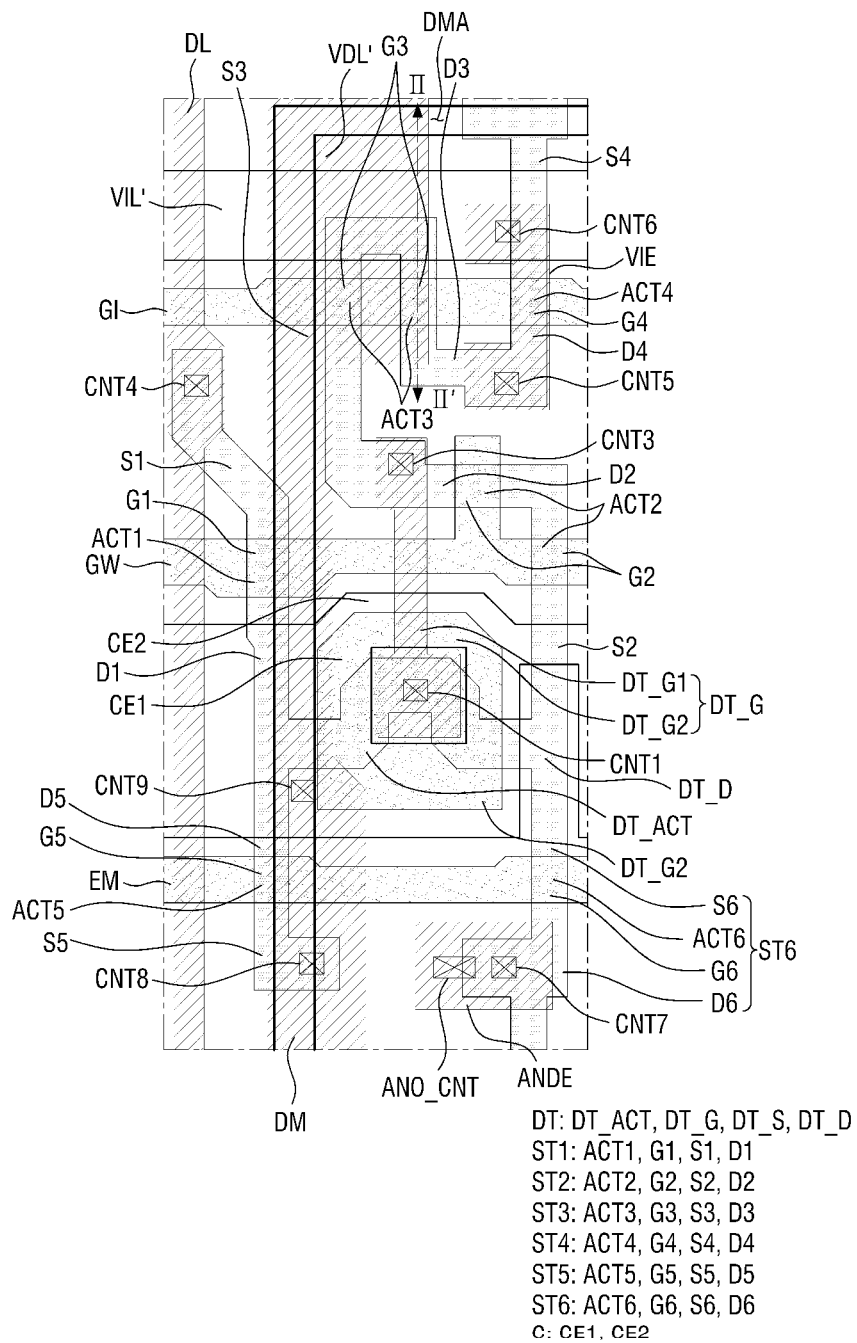
FIG. 16 shows a plan view showing a schematic diagram of an equivalent circuit of a pixel according to still another embodiment.
Figure 17:
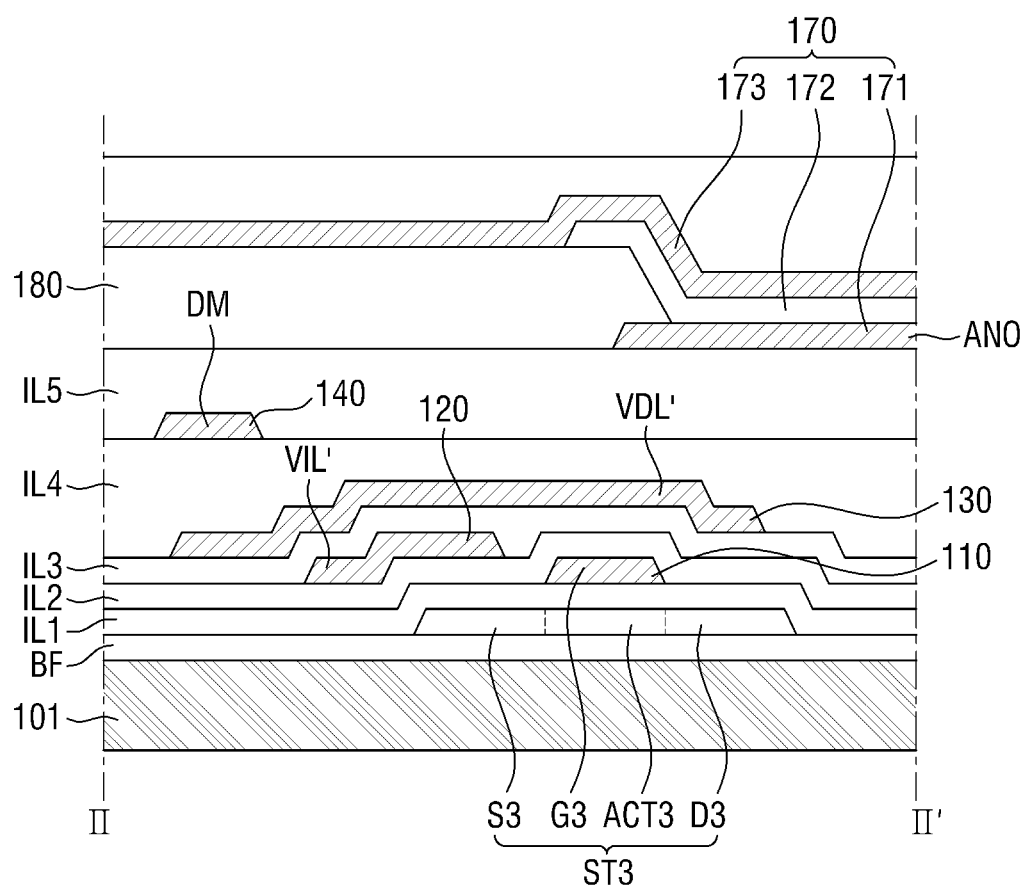
FIG. 17 shows a schematic cross-sectional view taken along line II-II' of FIG. 16.

FIG. 16 shows a plan view showing a schematic diagram of an equivalent circuit of a pixel according to still another embodiment. FIG. 17 shows a cross-sectional view taken along line II-II' of FIG. 16.

Referring to FIGS. 16 and 17, the embodiment thereof may differ from the embodiment of FIGS. 14 and 15 in that the first source voltage line VDL' may extend to overlap the horizontal portion DMA of the connection line DM.

The first source voltage line VDL' may be disposed between the connection line DM and the first scan line GI to overlap or face the horizontal portion DMA of the connection line DM and the first scan line GI. For example, the first source voltage line VDL' may overlap the horizontal portion DMA of the connection line DM in the thickness direction. Further, the first source voltage line VDL' may be disposed to overlap the first scan line GI in the thickness direction. For example, the first source voltage line VDL' may be further disposed between the horizontal portion DMA of the connection line DM and the first scan line GI. Thus, it may be possible to effectively prevent coupling between the horizontal portion DMA of the connection line DM and the first scan line GI, as described above.

Figure 18:
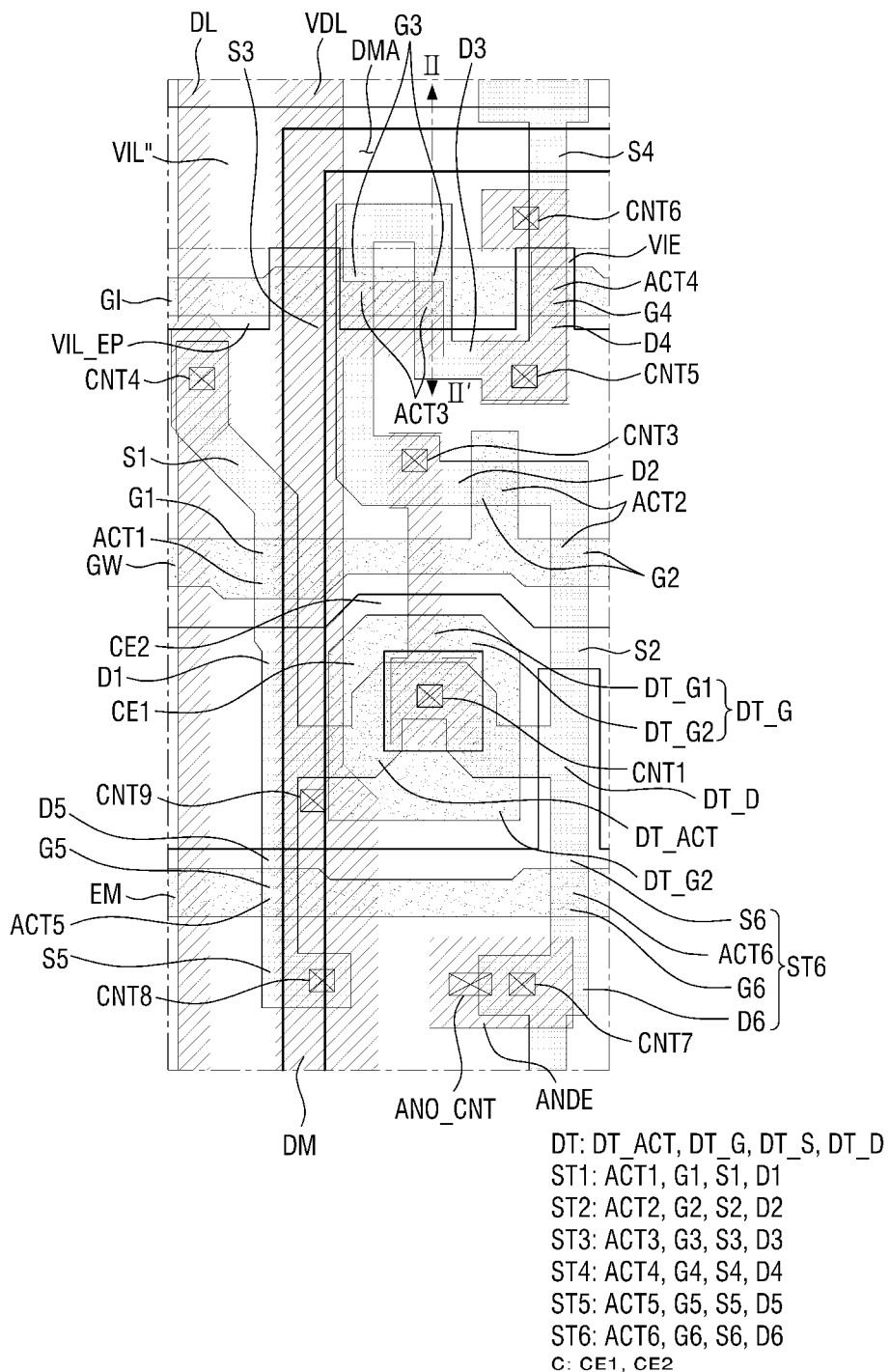
FIG. 18 shows a plan view showing a schematic diagram of an equivalent circuit of a pixel according to still another embodiment.
Figure 19:
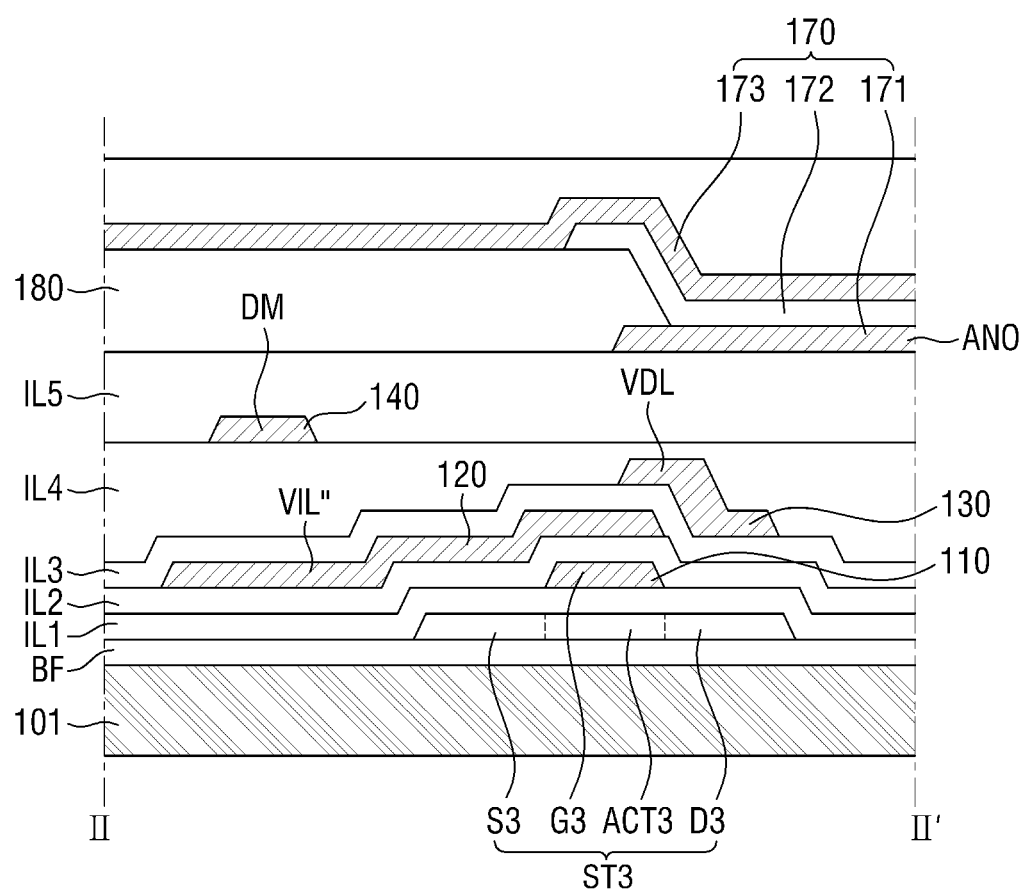
FIG. 19 shows a cross-sectional view taken along line II-II' of FIG. 18.

FIG. 18 shows a plan view showing a schematic diagram of an equivalent circuit of a pixel according to still another embodiment. FIG. 19 shows a schematic cross-sectional view taken along line II-II' of FIG. 18.

Referring to FIGS. 18 and 19, the embodiment thereof may differ from the embodiment of FIGS. 10 and 11 in that an initialization voltage line VIL" includes an extension portion VIL_EP.

The initialization voltage line VIL" may include an extension portion VIL_EP extending from a main portion of the initialization voltage line VIL" to a side thereof to define a periphery of such side. The extension portion VIL_EP may extend from the initialization voltage line VIL" disposed in the second direction DR2 along a direction opposite to the first direction DR1, i.e., downward in FIG. 18. The extension portion VIL_EP may be disposed so as to overlap or face the first scan line GI. The width of the extension portion VIL_EP in the first direction DR1 may be larger than the width of the first scan line GI in the first direction DR1. Because the extension portion VIL_EP of the initialization voltage line VIL" overlaps or faces the first scan line GI, it may be possible to effectively prevent coupling between the horizontal portion DMA of the connection line DM and the first scan line GI.

Figure 20:
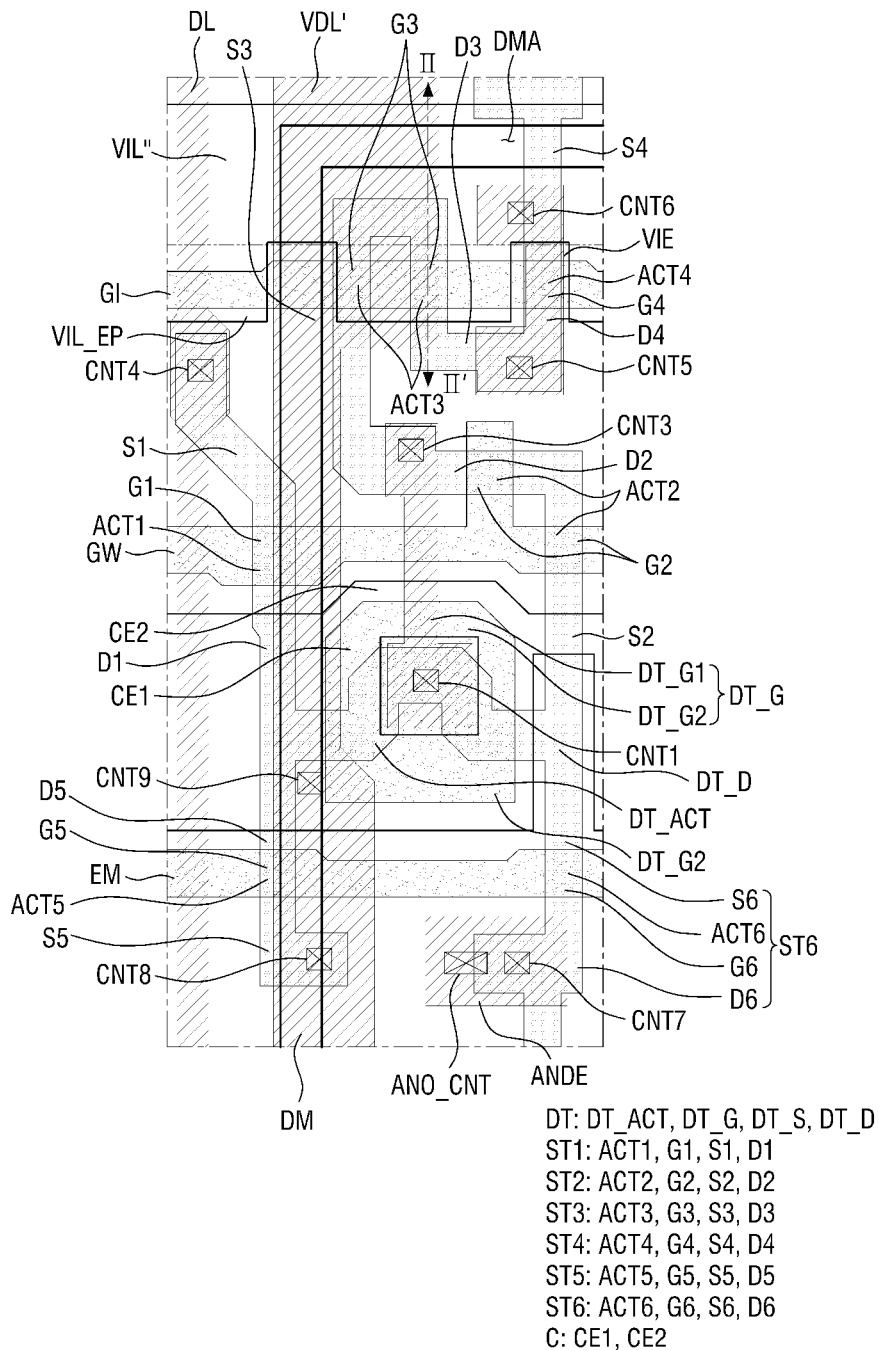
FIG. 20 shows a plan view showing a schematic diagram of an equivalent circuit of a pixel according to still another embodiment.
Figure 21:
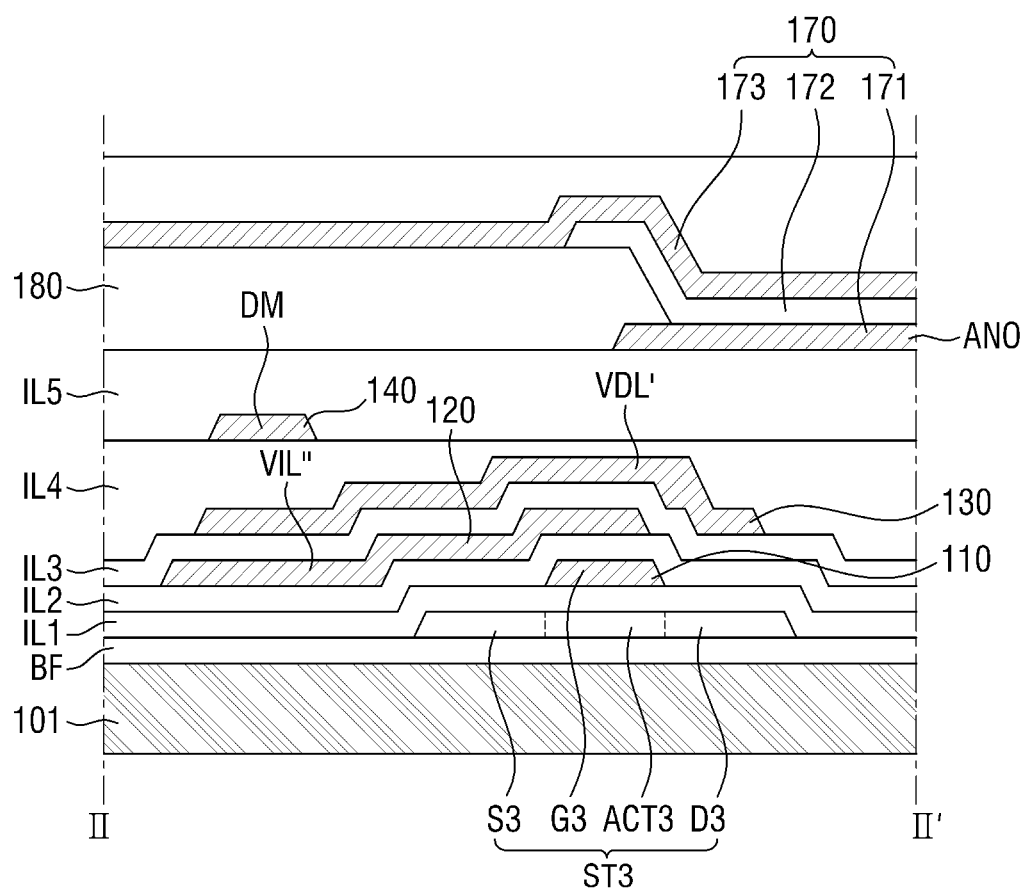
FIG. 21 shows a cross-sectional view taken along line II-II' of FIG. driving chip 20.

FIG. 20 shows a plan view showing a schematic diagram of an equivalent circuit of a pixel according to still another embodiment. FIG. 21 shows a schematic cross-sectional view taken along line II-II' of FIG. 20.

Referring to FIGS. 20 and 21, the embodiment thereof may differ from the embodiment of FIGS. 18 and 19 in that the first source voltage line VDL' may extend to overlap the horizontal portion DMA of the connection line DM.

The first source voltage line VDL' may be disposed between the connection line DM and the first scan line GI to overlap the horizontal portion DMA of the connection line DM and the first scan line GI. For example, the first source voltage line VDL' may overlap the horizontal portion DMA of the connection line DM in the thickness direction. Further, the first source voltage line VDL' may be disposed to overlap the first scan line GI in the thickness direction. For example, the first source voltage line VDL' may be further disposed between the horizontal portion DMA of the connection line DM and the first scan line GI. Thus, it may be possible to effectively prevent coupling between the horizontal portion DMA of the connection line DM and the first scan line GI, as described above.

Figure 22:
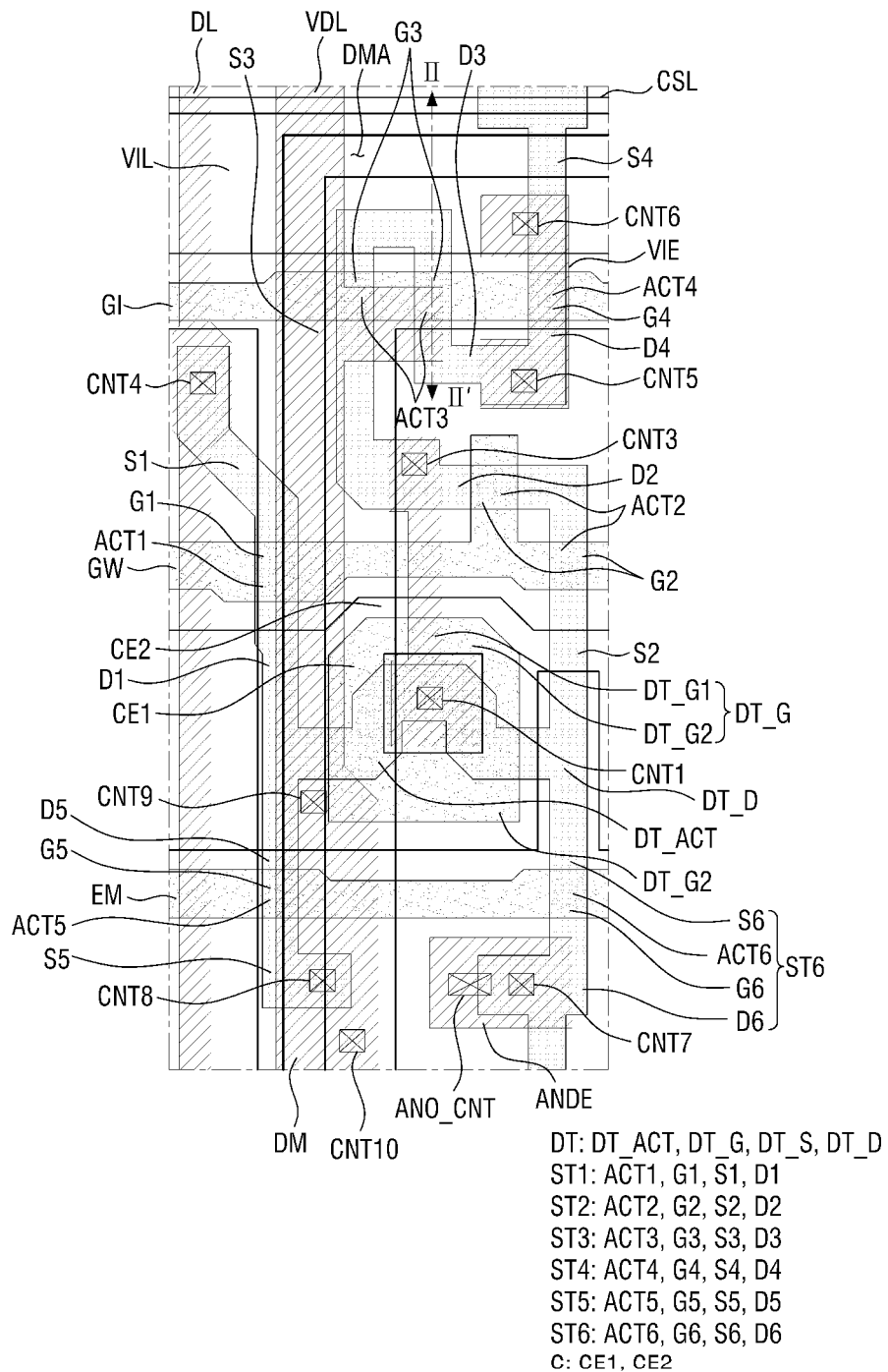
FIG. 22 shows a plan view showing a schematic diagram of an equivalent circuit of a pixel according to still another embodiment.
Figure 23:
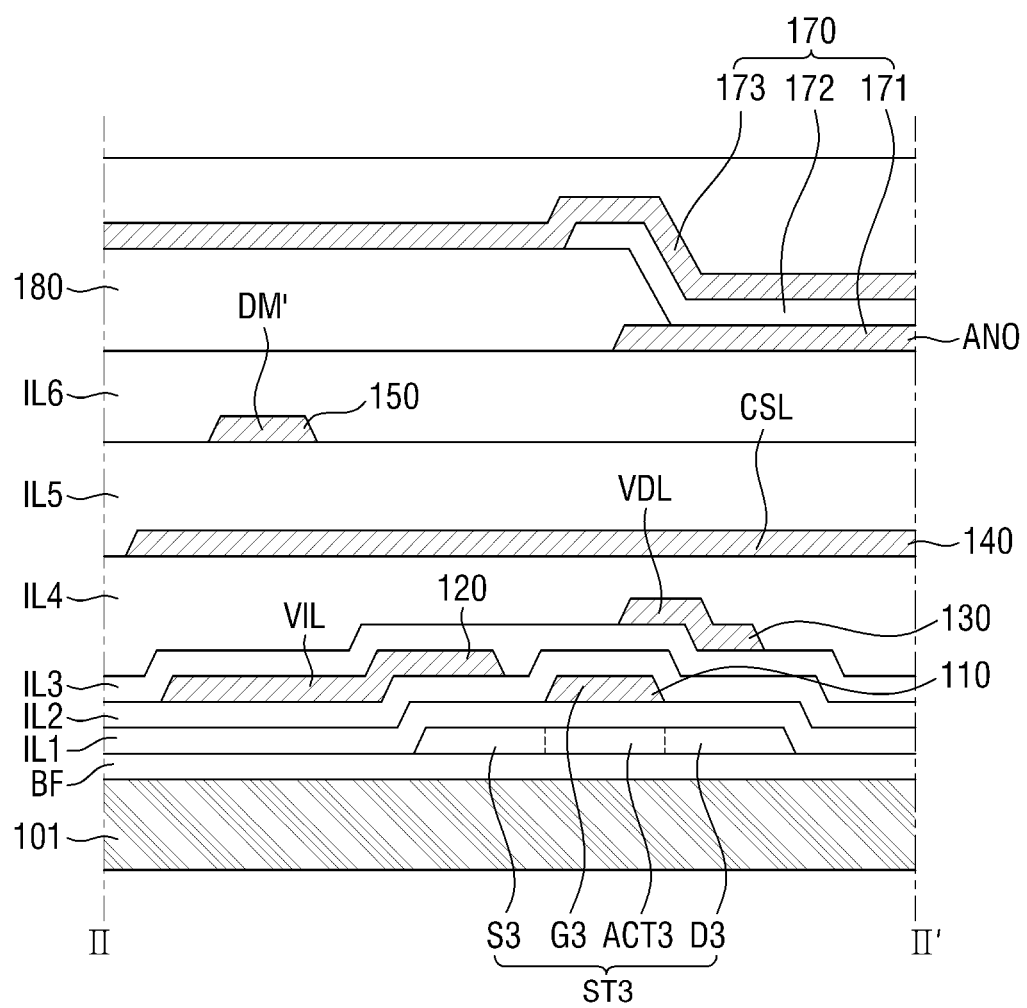
FIG. 23 shows a cross-sectional view taken along line II-II' of FIG. 22.

FIG. 22 shows a plan view showing a schematic diagram of an equivalent circuit of a pixel according to still another embodiment. FIG. 23 shows a cross-sectional view taken along line II-II' of FIG. 22.

Referring to FIGS. 22 and 23, the embodiment thereof may differ from the embodiment of FIGS. 10 and 11 in that a display device may further include a coupling blocking layer CSL disposed between a connection line DM' and the first scan line GI.

The coupling blocking layer CSL may be disposed to extend along the second direction DR2 in plan view and completely overlap or face the connection line DM'. Further, the coupling blocking layer CSL may be disposed to completely overlap or face the first scan line GI in plan view. By disposing the coupling blocking layer CSL to overlap or face the connection line DM' and the first scan line GI, it may be possible to effectively reduce and/or prevent coupling between two lines such as the connection line DM' and the first scan line GI.

The coupling blocking layer CSL may be disposed to extend along the first direction DR1 and overlap or face the first source voltage line VDL. The coupling blocking layer CSL may be electrically connected to the first source voltage line VDL through a tenth contact hole CNT10. Thus, a resistance of the first source voltage line VDL may be reduced.

The coupling blocking layer CSL may be disposed on the fourth insulating layer IL4. The coupling blocking layer CSL may be formed by the fourth conductive layer 140. In other words, the coupling blocking layer CSL may be implemented by the fourth conductive layer 140, such that the fourth conductive layer 140 includes the coupling blocking layer CSL that may thus be defined by the fourth blocking layer 140.

The fifth insulating layer IL5 may be disposed on the fourth conductive layer 140, and the connection line DM' may be disposed on the fifth insulating layer IL5. The connection line DM' may be formed of a fifth conductive layer 150. In other words, the connection line DM' may be implemented by the fifth conductive layer 150, such that that the fifth conductive layer 150 includes the connection line DM' that may thus be defined by the fifth conductive layer 150. The fifth conductive layer 150 may include the same material as the fourth conductive layer 140 or may include one or more materials selected from the materials exemplified as the constituent materials of the fourth conductive layer 140.

A sixth insulating layer IL6 may be disposed on the fifth conductive layer 150. The sixth insulating layer IL6 may be a via layer. The sixth insulating layer IL6 may include the same material as the fifth insulating layer IL5 or may include one or more materials selected from the materials exemplified as the constituent materials of the fifth insulating layer IL5.

The first electrode layer 171 may be disposed on the sixth insulating layer IL6.

Figure 24:
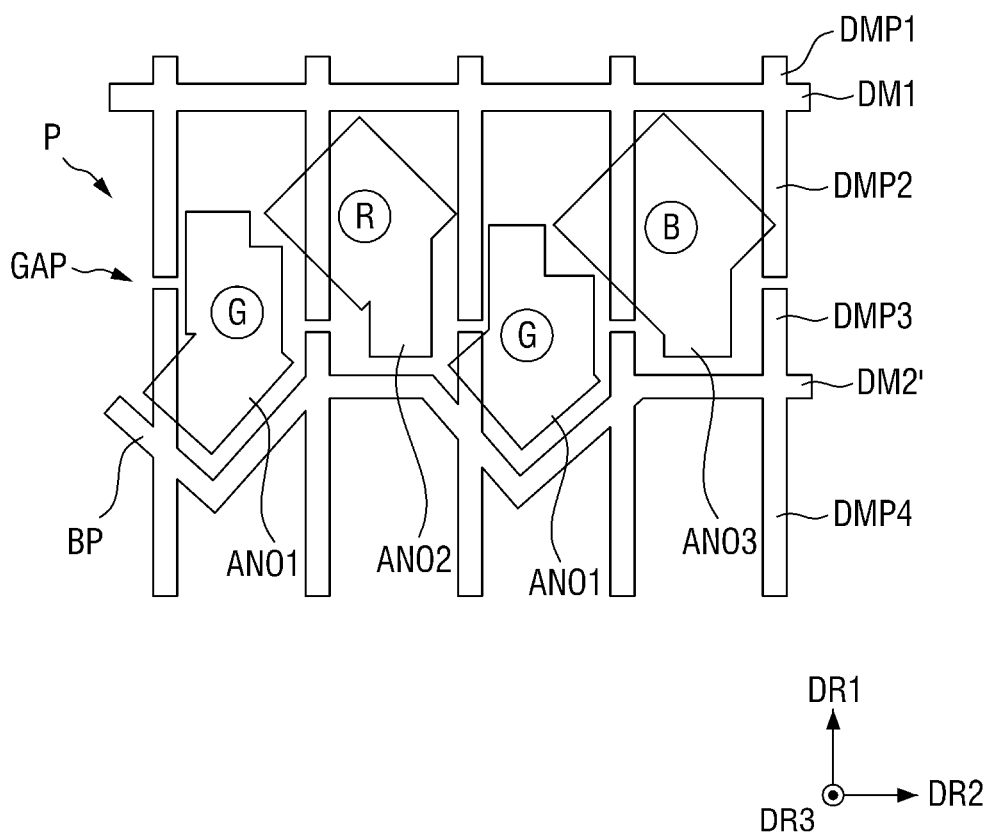
FIG. 24 shows a plan view showing a connection line according to still another embodiment.

FIG. 24 shows a plan view showing a connection line according to still another embodiment.

Referring to FIG. 24, the embodiment thereof may differ from the embodiment of FIG. 6 in that the connection lines of the display device 1 may include branch patterns DMP1, DMP2, DMP3 and DMP4.

The first horizontal portion DM1 of a connection line DM may include a first branch pattern DMP1 and a second branch pattern DMP2, and a second horizontal portion DM2' of another connection line DM may include a third branch pattern DMP3 and a fourth branch pattern DMP4.

The first branch pattern DMP1 may protrude from one side of the first horizontal portion DM1 in the first direction DR1, and the second branch pattern DMP2 may protrude from the other side of the first horizontal portion DM1 in a direction opposite to the first direction DR1.

The third branch pattern DMP3 may protrude from one side of the second horizontal portion DM2' in the first direction DR1, and the fourth branch pattern DMP4 may protrude from the other side of the second horizontal portion DM2' in a direction opposite to the first direction DR1.

The first to fourth branch patterns DMP1, DMP2, DMP3 and DMP4 may be disposed in parallel with each other. Further, the first to fourth branch patterns DMP1, DMP2, DMP3 and DMP4 disposed along a same column may be aligned with each other, such that ends of, for example, the second branch pattern DMP2 and the third branch pattern DMP3 may or may not be adjacent to each other.

The first to fourth branch patterns DMP1, DMP2, DMP3 and DMP4 may be arranged along the second direction DR2 at same intervals. The interval at which the first to fourth branch patterns DMP1, DMP2, DMP3 and DMP4 are arranged in the second direction DR2 may be the same as the interval at which the vertical portions DMB of the connection lines DM are arranged in the second direction DR2. Accordingly, the first to fourth branch patterns DMP1, DMP2, DMP3 and DMP4 may implement a grid pattern shape in the display area DA together with the horizontal portions DMA. As a result, it may be possible to minimize irregularities of the vertical portions and the horizontal portions of the connection lines DM, thereby preventing the pattern from being visually recognized.

One end of the second branch pattern DP2 and one end of the third branch pattern DP3 may be spaced apart from each other. Thus, a gap GAP may be defined between one end of the second branch pattern DP2 and one end of the third branch pattern DP3. The gap GAP may be disposed so as not to overlap the anode electrode ANO. In other words, the gap GAP may be offset from the anode electrode ANO. For example, the gap GAP may be disposed in a space between the first to third anode electrodes ANO1, ANO2 and ANO3. One end of the second branch pattern DP2 and one end of the third branch pattern DP3 may be disposed so as not to overlap or face the anode electrode ANO.

Figure 25:
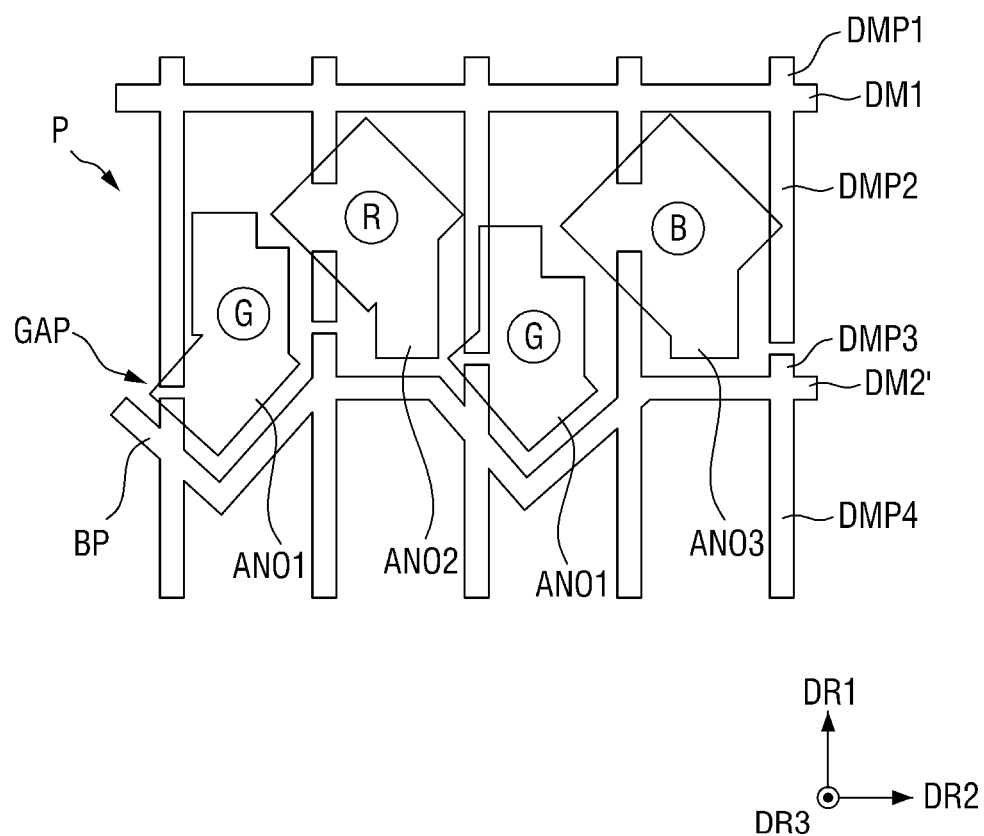
FIG. 25 shows a plan view showing a connection line according to still another embodiment.

FIG. 25 is a plan view showing a connection line according to still another embodiment.

Referring to FIG. 25, the embodiment thereof may differ from the embodiment of FIG. 24 in that the gap may be disposed to overlap the anode electrode ANO.

The gap may be disposed to overlap the first to third anode electrodes ANO1, ANO2 and ANO3. The size of the gap GAP overlapping each of the anode electrodes ANO1, ANO2 and ANO3 may differ according to the sizes of the anode electrodes ANO1, ANO2 and ANO3. For example, the gap GAP overlapping the first anode electrode ANO1 may be smaller than the gap GAP overlapping the second anode electrode ANO2. Further, the gap GAP overlapping the first anode electrode ANO1 may be smaller than the gap GAP overlapping the third anode electrode ANO3.

As described above, the display device 1 according to the embodiment is configured such that the first to third anode electrodes ANO1, ANO2 and ANO3 may overlap or face the gap GAP, thereby shielding the gap GAP disposed in the display area DA. Thus, it may be possible to prevent a phenomenon in which non-uniformity in luminance among pixels may be visually recognized, and external light may be reflected because of the gap GAP, thereby further improving the display quality of an image to be displayed.

Figure 26:
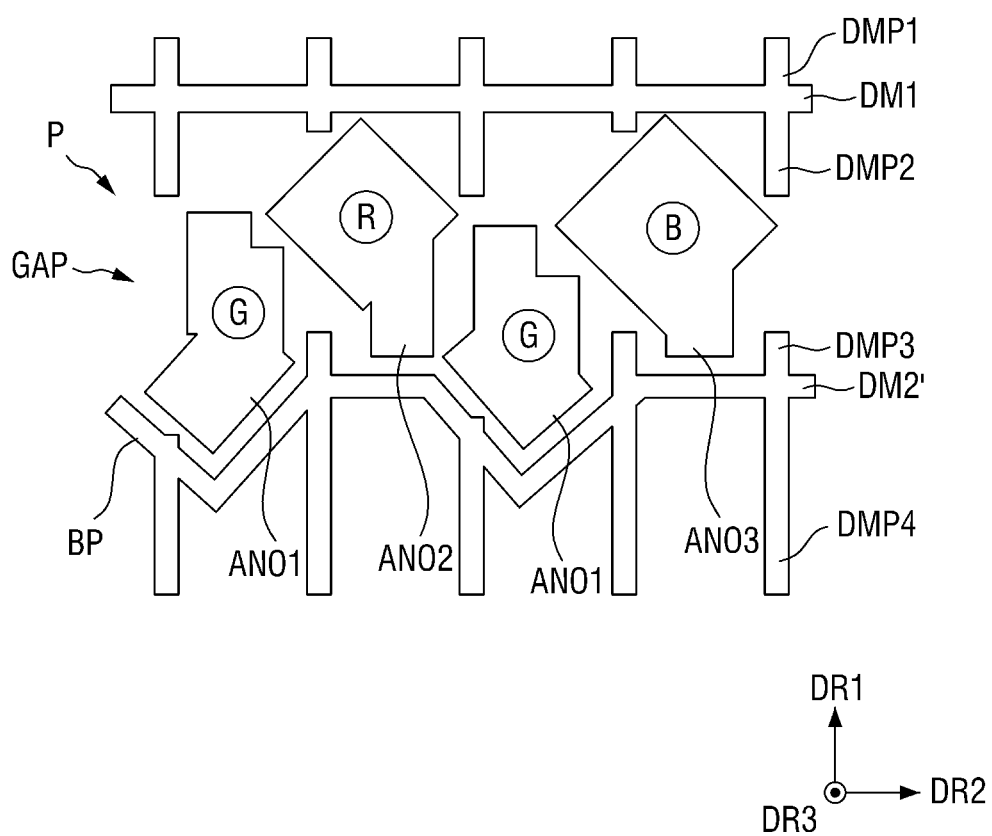
FIG. 26 shows a plan view showing a connection line according to still another embodiment.

FIG. 26 shows a plan view showing a connection line according to still another embodiment.

Referring to FIG. 26, the embodiment may differ from the embodiment of FIG. 24 in that the branch patterns DMP1, DMP2, DMP3 and DMP4 may be disposed so as not to overlap the anode electrode ANO, i.e., may be offset from the anode electrode ANO.

The anode electrode ANO may be disposed so as not to overlap, or be offset from, the gap GAP between the second pattern DMP2 and the third pattern DMP3 in plan view. That is, the anode electrode ANO may be disposed between the second branch pattern DMP2 and the third branch pattern DMP3, which face each other. For example, the anode electrode ANO may be disposed in the gap GAP defined between one end of the second branch pattern DMP2 and one end of the third branch pattern DMP3.

Figure 27:
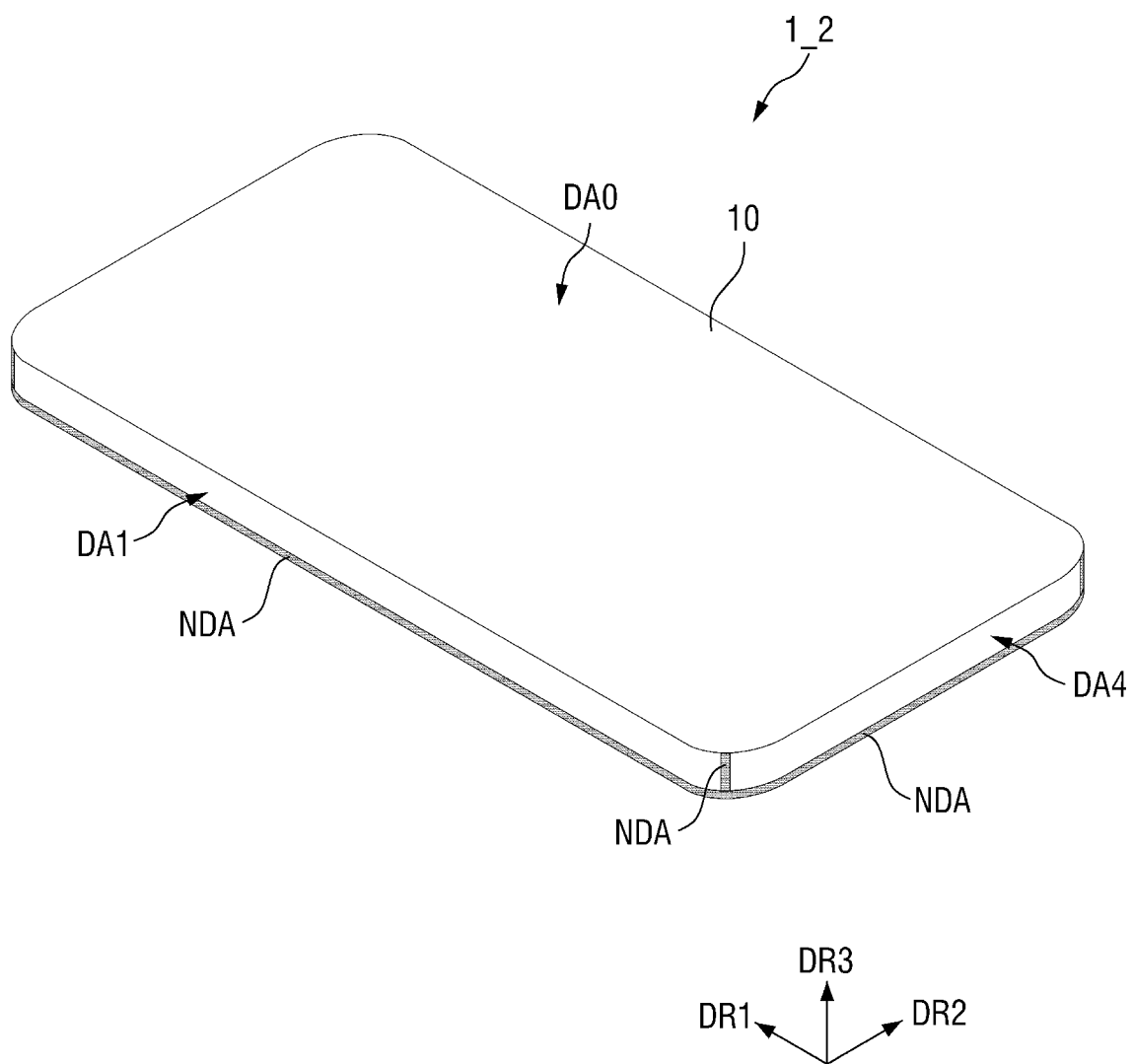
FIG. 27 shows a perspective view of a display device according to still another embodiment.
Figure 28:
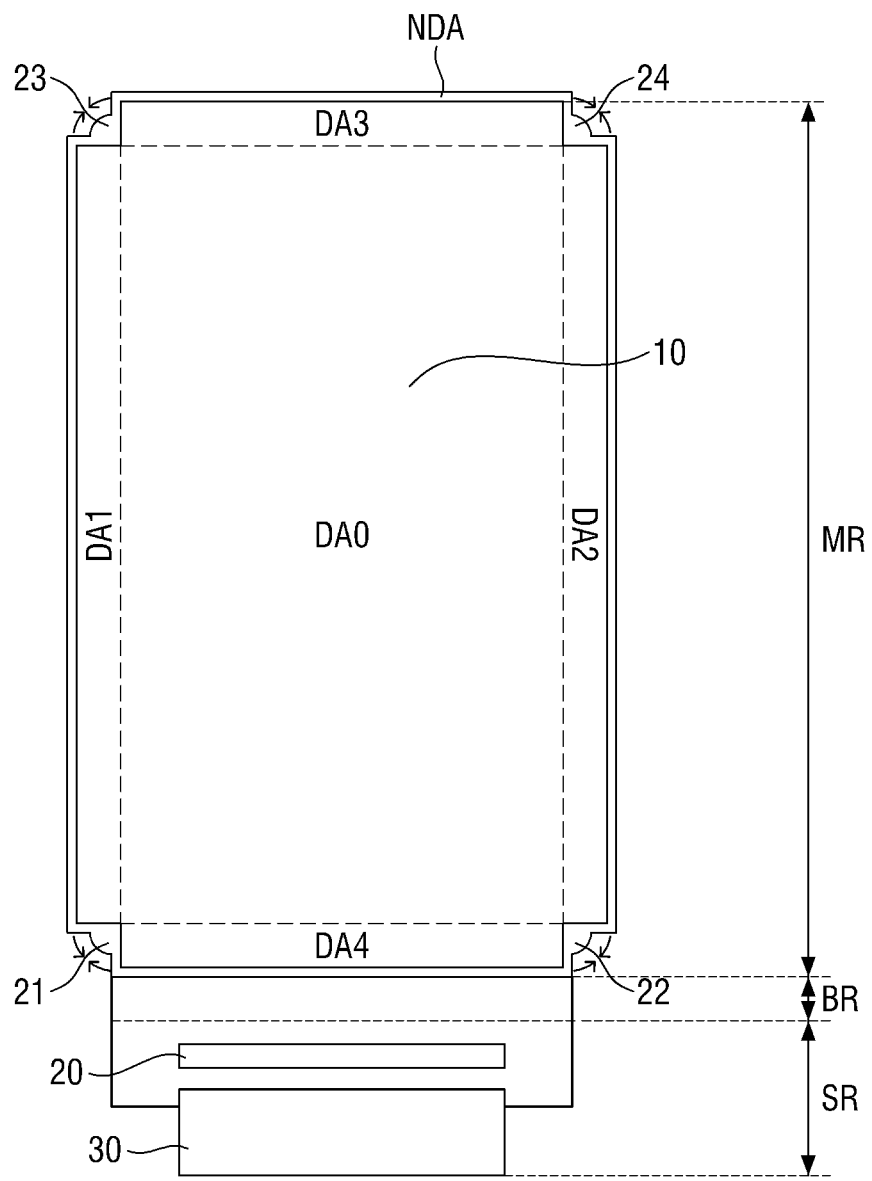
FIG. 28 shows a development view of the display device of FIG. 27.
Figure 28:
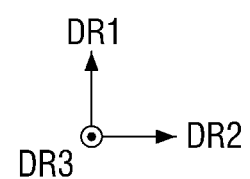
Figure 29:
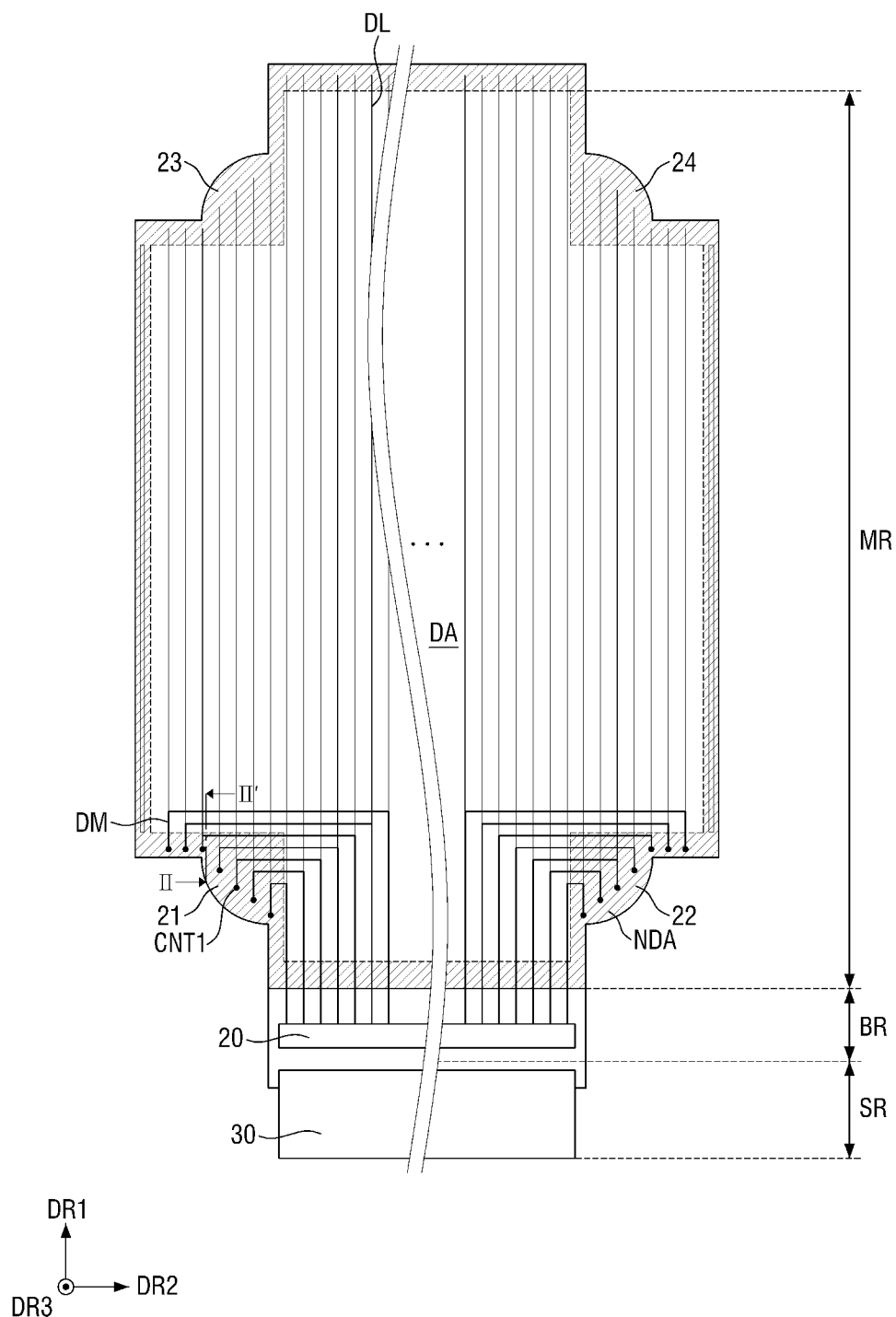
FIG. 29 shows a plan view showing signal lines and connection lines of the display device of FIG. 27.

FIG. 27 shows a perspective view of a display device according to still another embodiment. FIG. 28 shows a development view of the display device of FIG. 27. FIG. 29 shows a plan view showing signal lines and connection lines of the display device of FIG. 27.

Referring to FIGS. 27 and 29, a display device 1_2 according to the embodiment may include, as the display area DA, a main display area DA0 and first to fourth sub-display areas DA1 to DA4.

The main display area DA0 may be located on one plane of the display device 1_2 and have the largest area (or size) among the main display area DA0 and the first to fourth sub-display areas DA1 to DA4. For example, the main display area DA0 may be located on the upper surface of the display device 1_2. The main display area DA0 may have a planar shape such as a polygonal shape such as a rectangle, a circle, or an ellipse.

The first to fourth sub-display areas DA1 to DA4 may be located on a plane different from the plane on which the main display area DA0 is located. Each of the first to fourth sub-display areas DA1 to DA4 may have an area smaller than the area of the main display area DA0, and the first to fourth sub-display areas DA1 to DA4 may be located on different planes. The first to fourth sub-display areas DA1 to DA4 may extend from the sides of the main display area DA0.

The main display area DA0 and the first to fourth sub-display areas DA1 to DA4 may be disposed in the main region MR.

In the development view of FIG. 28 for the display device 1_2, the non-display area NDA may be disposed along the outermost edges of the main display area DA0 and the first to fourth sub-display areas DA1 to DA4.

The non-display area NDA may include first to fourth corner portions 21, 22, 23 and 24. Each of the first to fourth corner portions 21, 22, 23 and 24 may be disposed adjacent to a corner (i.e., a portion where two sides meet) of the main display area DA0.

The first to fourth corner portions 21, 22, 23 and 24 may be substantially identical to each other except for their positions. Hereinafter, common features of the first to fourth corner portions 21, 22, 23 and 24 will be described on the basis of the first corner portion 21, and a redundant description will be omitted.

The first corner portion 21 may have a shape protruding outward from the corner of the main display area DA0. The first corner portion 21 may be located between the first sub-display area DA1 and the fourth sub-display area DA4, and an intersection angle between the first sub-display area DA1 and the fourth sub-display area DA4 may be converted into an obtuse angle. One end of the first corner portion 21 may be located in the first sub-display area DA1 and the other end of the first corner portion 21 may be located in the fourth sub-display area DA4.

The first corner portion 21 may provide a space for passing or arranging the signal lines DL. In a case that the first sub-display area DA1 and the fourth sub-display area DA4 of the display panel 10 may be bent, the first corner portion 21 may be folded inward (i.e., in a direction toward an inner space or the center of gravity of the display device 1). The first corner portion 21 may be folded such that one end (i.e., a first portion adjacent to the first sub-display area DA1) of the first corner portion 21 and the other end (i.e., a second portion adjacent to the fourth sub-display area DA4) of the first corner portion 21 may face each other. One end and the other end of the first corner portion 21 may be in contact with each other or may be coupled through a coupling layer or the like.

Since the first corner portion 21 may be folded inward in a case that the first sub-display area DA1 and the fourth sub-display area DA4 may be bent, the first corner portion 21 may not be exposed to the outside. Therefore, the first to fourth corner portions 21, 22, 23 and 24 may be included in the non-display area NDA.

The non-display area NDA may further include the bending region BR and the sub-region SR, and the bending region BR may be connected to at least one of the first to fourth sub-display areas DA1 to DA4. For example, the bending region BR may be connected to one side of the fourth sub-display area DA4 (e.g., the lower side of the fourth sub-display area DA4 in the development view of the display device 1_2).

As shown in FIG. 28, in a case that the fourth sub-display area DA4 may be bent vertically with respect to the main display area DA0, the bending region BR may be bent once again vertically with respect to the fourth sub-display area DA4 (i.e., bent at an angle of 180° with respect to the main display area DA0), and the sub-region SR located at one side of the bending region BR may be disposed below the main display area DA0 in a thickness direction of the main display area DA0. The sub-region SR may overlap or face the main display area DA0 and may be disposed in parallel with the main display area DA0.

A driving chip IC may be disposed in the sub-region SR. As described above, as the sub-region SR may be bent and reversed from the main display area DA0, and the upper surface of the driving chip IC may face in a direction opposite to the third direction DR3. The driving chip IC of the embodiment may be substantially the same as the driving chip 20 described with reference to FIGS. 1 to 3.

The connection lines DM may extend along the first direction DR1 from the non-display area NDA on the lower side of the fourth sub-display area DA4, and extend in the direction opposite to the second direction DR2 by switching their direction in the display area DA. A respective connection line DM may extend to one end of the corresponding signal line DL to be disposed in an area adjacent to the corresponding signal line DL that is connected to the respective connection line DM. That is, the connection lines DM may extend from the lower side of the fourth sub-display area DA4, through the main display area DA0, and to the non-display area NDA and the first corner portion 21 on the lower side of the first sub-display area DA1. The connection lines DM may be directly connected one-to-one to the corresponding signal lines DL through the first contact holes CNT1 located in the first corner portion 21 and the non-display area NDA on the lower side of the first sub-display area DA1.

As described above, since the display device 1_2 may include the connection lines DM disposed via the display area DA, an additional dead space required to connect the signal lines DL disposed in the first sub-display area DA1 to the driving chip 20 may be unnecessary. That is, overall dead space of the display device may be reduced or its increase may be minimized.

In concluding the detailed description, those skilled in the art will appreciate that many variations and modifications can be made to the disclosed embodiments without substantially departing from the principles as described in connection therewith. Therefore, the disclosed embodiments may be appreciated in a generic and descriptive sense only and not as limiting of the aforementioned principles.

What is claimed is:

1. A display device, comprising:
  a substrate including a display area and a non-display area;
  a plurality of signal lines disposed in the display area and extending in a first direction from the non-display area to the display area;
  a connection line extending from a portion of the non-display area to another portion of the non-display area via the display area and being electrically connected to a respective signal line of the plurality of signal lines in the non-display area; and
  an initialization voltage line extending in a second direction intersecting the first direction,
  wherein the connection line overlaps the initialization voltage line in a thickness direction of the display device.

2. The display device of claim 1, further comprising:
  a second conductive layer which includes the initialization voltage line,
  a third conductive layer disposed on the second conductive layer, and which includes the respective signal line of the plurality of signal lines, and
  a fourth conductive layer disposed on the third conductive layer, and which includes the connection line.

3. The display device of claim 2, further comprising:
  a first source voltage line disposed between the initialization voltage line and the connection line, and
  wherein the first source voltage line overlaps the connection line in the thickness direction of the display device.

4. The display device of claim 3, further comprising:
  a scan line disposed between the substrate and the initialization voltage line, and
  wherein the first source voltage line overlaps the scan line in the thickness direction of the display device.

5. The display device of claim 4, further comprising:
  a first conductive layer disposed between the substrate and the second conductive layer, and which includes the scan line, and
  wherein the third conductive layer incudes the first source voltage line.

6. The display device of claim 5, wherein the connection line includes a horizontal portion extending in the second direction, and
  the initialization voltage line is disposed between the horizontal portion and the scan line in plan view.

7. The display device of claim 6, wherein the horizontal portion of the connection line overlaps the first source voltage line in the thickness direction of the display device.

8. The display device of claim 7, further comprising:
  an anode electrode disposed above the connection line,
  wherein the horizontal portion of the connection line is offset from the anode electrode in the thickness direction of the display device.

9. The display device of claim 8, wherein the initialization voltage line overlaps the scan line in the thickness direction of the display device.

10. The display device of claim 2, further comprising:
  a coupling blocking layer disposed between the initialization voltage line and the connection line, and
  wherein the coupling blocking layer overlaps the connection line in the thickness direction of the display device.

11. The display device of claim 10, further comprising:
  a first source voltage line disposed between the initialization voltage line and the connection line,
  wherein the coupling blocking layer is electrically connected to the first source voltage line.

12. A display device, comprising:
  a substrate including a display area and a non-display area;
  an initialization voltage line disposed on the substrate;
  a plurality of signal lines disposed over the display area and the non-display area and extending in a first direction;
  a plurality of connection lines disposed in the display area and connected to the signal lines, respectively; and
  an anode electrode disposed between a first connection line and a second connection line of the plurality of connection lines,
  wherein each connection line includes a horizontal portion extending in a second direction intersecting the first direction, and
  the horizontal portion overlaps the initialization voltage line in a thickness direction of the display device, and is offset from the anode electrode.

13. The display device of claim 12, wherein the horizontal portion of each connection line includes a first horizontal portion disposed adjacent to one side of the anode electrode and a second horizontal portion disposed adjacent to another side of the anode electrode in plan view, and the second horizontal portion includes a bent portion which is bent to correspond to an edge of the anode electrode.

14. The display device of claim 13, wherein the first horizontal portion includes a first branch pattern protruding from one side of the first horizontal portion in the first direction intersecting the second direction and a second branch pattern protruding from another side of the first horizontal portion in a direction opposite to the first direction, and the second horizontal portion includes a third branch pattern protruding from one side of the second horizontal portion in the first direction and a fourth branch pattern protruding from another side of the second horizontal portion in the direction opposite to the first direction.

15. The display device of claim 14, wherein the second branch pattern and the third branch pattern are disposed adjacent to and spaced from each other to define a gap therebetween, and the gap overlaps the anode electrode.

16. The display device of claim 14, wherein the anode electrode is disposed between the second branch pattern and the third branch pattern, and is offset from the second branch pattern and the third branch pattern.

17. The display device of claim 16, further comprising:
a second conductive layer which includes the initialization voltage line,
a third conductive layer disposed on the second conductive layer, and which includes the plurality of signal lines, and
a fourth conductive layer disposed on the third conductive layer, and which includes the plurality of connection lines.

18. The display device of claim 17, further comprising:
a scan line disposed between the substrate and the initialization voltage line,
wherein the scan line is offset from the horizontal portion in the thickness direction of the display device.

19. The display device of claim 18, further comprising:
a first source voltage line disposed between the initialization voltage line and the connection line,
wherein the first source voltage line overlaps the connection line in the thickness direction of the display device.

20. The display device of claim 19, further comprising:
a first conductive layer disposed between the substrate and the second conductive layer, and which includes the scan line, and
wherein the third conductive layer includes the first source voltage line.

\* \* \* \* \*